(12) United States Patent
Unno

(10) Patent No.: US 8,432,530 B2
(45) Date of Patent: Apr. 30, 2013

(54) DEVICE, METHOD, AND SYSTEM FOR MEASURING IMAGE PROFILES PRODUCED BY AN OPTICAL LITHOGRAPHY SYSTEM

(75) Inventor: Yasuyuki Unno, Irvine, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 1084 days.

(21) Appl. No.: 12/177,845

(22) Filed: Jul. 22, 2008

(65) Prior Publication Data
US 2010/0020303 A1    Jan. 28, 2010

(51) Int. Cl.
G03B 27/42    (2006.01)

(52) U.S. Cl.
USPC .................................. 355/53; 355/67; 355/72

(58) Field of Classification Search ............ 355/53, 355/67, 72
See application file for complete search history.

(56) References Cited

U.S. PATENT DOCUMENTS

| 5,631,731 | A | 5/1997 | Sogard | 356/121 |
|---|---|---|---|---|
| 5,866,935 | A | 2/1999 | Sogard | 257/435 |
| 6,906,305 | B2 | 6/2005 | Pease et al. | 250/208.1 |
| 7,053,355 | B2 | 5/2006 | Ye et al. | 250/208.1 |
| 7,136,143 | B2 | 11/2006 | Smith | 355/52 |
| 7,184,137 | B1 | 2/2007 | Adler | 356/237.2 |
| 2006/0192936 | A1 | 8/2006 | Schenau et al. | 355/69 |
| 2006/0273242 | A1 | 12/2006 | Hunsche et al. | 250/208.1 |
| 2007/0091386 | A1 | 4/2007 | Unno | 358/489 |
| 2008/0074758 | A1 | 3/2008 | Unno | 359/738 |

OTHER PUBLICATIONS

Rieger, et al. "Layout Design Methodologies for Sub-Wavelength Manufacturing", pp. 85-88.

Primary Examiner — Hung Henry Nguyen
Assistant Examiner — Mesfin T Asfaw
(74) Attorney, Agent, or Firm — Fitzpatrick, Cella, Harper & Scinto

(57) ABSTRACT

Measuring an aerial image with an aerial image measuring device having a light detector and a light blocking layer for separating polarization components of light incident thereon. The light blocking layer has first and second apertures structured differently from each other, wherein the different structures transmit at least one of the polarization components differently. The detector provides separate samples for light transmitted through the first and second apertures. Separate image profiles for each polarization component of the aerial image are generated using the samples provided by the detector. Image recovery for each of the generated image profiles is performed to generate estimated image profiles for each polarization component of the aerial image that exclude the effects of transmission through the first and second apertures of the aerial image measuring device.

34 Claims, 30 Drawing Sheets

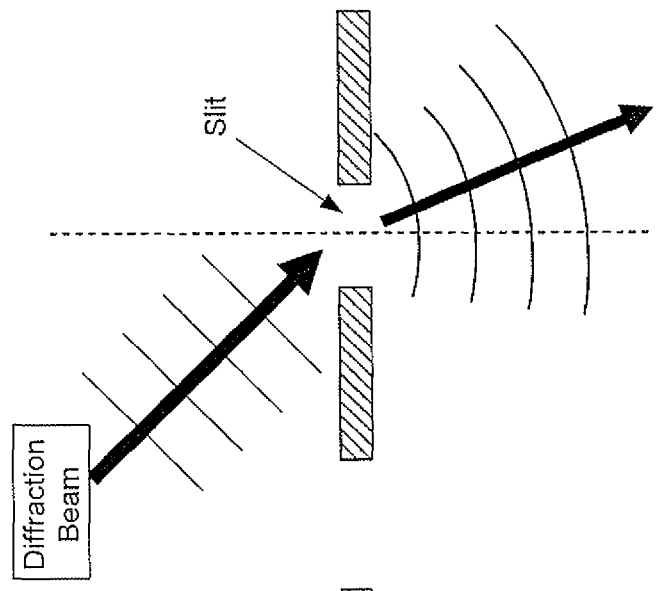
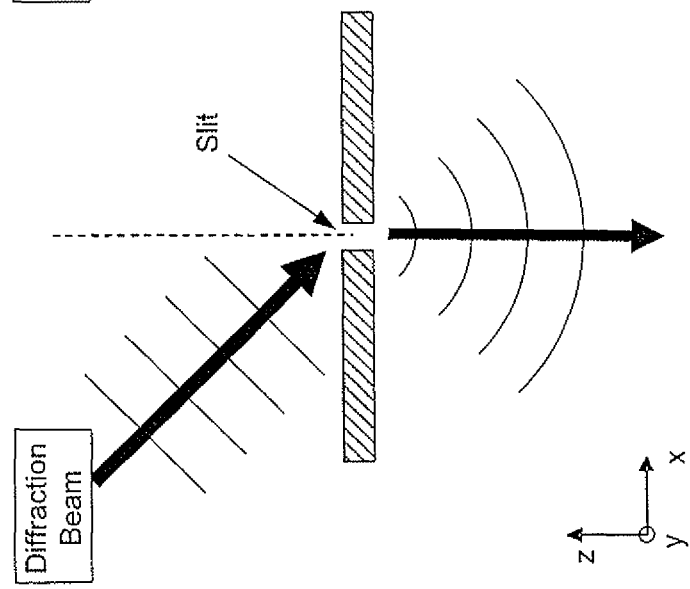
FIG. 8B
FIG. 8A

DEVICE, METHOD, AND SYSTEM FOR MEASURING IMAGE PROFILES PRODUCED BY AN OPTICAL LITHOGRAPHY SYSTEM

BACKGROUND

1. Field

The present disclosure relates to aerial image measurement, and more particularly relates to measuring an aerial image produced by an optical lithography system.

2. Description of the Related Art

FIG. 1 shows the configuration of a typical optical lithography system 1 used for the manufacturing of semiconductor devices. A wafer 3 is positioned on wafer stage 6, and illumination system 4 illuminates a pattern 5 on reticle 2 thereby generating light beams that are projected onto the wafer 3 by the projection lens 7 to create an image 8 corresponding to the pattern 5. Typical optical projection lithography systems 1 include an illumination system 4 that may use one or more illumination source points to generate beams that form the image 8 projected onto wafer 3.

To evaluate the effects of lens aberrations, illumination conditions, and other factors that affect the image performance of the lithography system 1, an aerial image corresponding to image 8 is measured. A measuring device 9 for measuring the aerial image is positioned on wafer stage 6, and by moving wafer stage 6 along the x and/or y direction, the aerial image can be measured by measuring device 9.

It should be understood that there is a difference between the aerial image and the measuring device's measurement of the aerial image. The aerial image is a projected image that cannot be viewed normally, but which would have been imaged onto wafer 3 if wafer 3 had been positioned by wafer stage 6 beneath projection lens 7. Instead, since aerial image measuring device 9 has been positioned beneath projection lens 7, the aerial image is not imaged but rather is measured. Measurement is ordinarily performed by sampling the aerial image through slit apertures that form part of measuring device 9, often coupled with movement of measuring device 9 so that different regions of the aerial image are sampled.

One goal of aerial image measurement is to calculate the actual aerial image that would have been projected and imaged onto wafer 3 if wafer 3 had been present, based on the measured aerial image. This calculation is often hampered by optical properties of measuring device 9, such that it is sometimes difficult to recreate an accurate depiction of the actual aerial image based on measurements obtained by measuring device 9.

SUMMARY

One such effect is caused by polarization of the aerial image. Specifically, the aerial image contains both Transverse Magnetic (TM) and Transverse Electric (TE) components of polarization. Because measuring device 9 uses slit apertures for sampling of the aerial image, and because slit apertures respond differently to TE-polarized components as compared to TM-polarized components, it is ordinarily difficult to recreate the actual aerial image based on measurements obtained by measuring device 9.

U.S. Pat. No. 5,631,731 recognizes this difficulty. To address it, the cited patent proposes the use of two similarly structured apertures with different polarization dependencies. The proposal in this U.S. Pat. No. 5,631,731 differs significantly from the disclosure herein.

According to one aspect of the disclosure herein, an aerial image measuring device includes a pair of apertures which are structured differently from each other, wherein the different structures transmit at least one of TM and TE polarization differently. In one example embodiment, a first aperture is slit-shaped, whereas a second aperture is a linear array of pin-holes. Because of the differences in structure, it becomes possible to separate effects caused by TM-vs-TE polarization components in the aerial image, thereby leading to improved accuracy in calculation of the actual aerial image from the measured samples.

According to one aspect of the disclosure, an aerial image measuring device having both a slit and a pinhole array aperture is provided in an optical lithography system, so as to obtain an image profile of an aerial image which substantially excludes the effects of light transmission through the apertures of the measuring device. More particularly, the optical lithography system includes an illumination system, a reticle, a projection lens, a moveable wafer stage, an aerial image measuring device, and a control device for controlling the aerial image measuring device and the wafer stage.

The aerial image measuring device has a light detector and a light blocking layer for separating polarization components of light incident thereon. The light blocking layer has first and second apertures structured differently from each other, wherein the different structures transmit at least one of the polarization components differently. The detector provides separate samples for light transmitted through the first and second apertures.

The aerial image measuring device is positioned on the wafer stage, and the illumination system illuminates a pattern on the reticle to generate light beams that are projected onto the aerial image measuring device by the projection lens to create an aerial image corresponding to the pattern. The control device controls the wafer stage to move so that the aerial image is scanned by the aerial image measuring device. The control device also receives the samples provided by the detector, generates separate image profiles for each polarization component of the aerial image using the samples provided by the detector, and performs image recovery for each of the generated image profiles to generate an estimated image profile of the aerial image that excludes the effects of transmission through the first and second apertures of the aerial image measuring device.

Using this optical lithography system, an image profile that may accurately represent the imaging performance of the optical lithography system may be generated. Moreover, such an image profile may be generated for an image containing multiple polarization components. More specifically, because separate image profiles for each polarization component of the aerial image are generated, image recovery that addresses properties of image profile change unique to each polarization component may be performed. For example, image recovery for the generated image profile for a Transverse Electric (TE) polarization component can address angular properties of transmittance, whereas image recovery for the generated image profile for a Transverse Magnetic (TM) polarization component can address both polarization change properties and angular properties of transmittance.

The first aperture can comprise a slit, and the second aperture can comprise a pinhole array. The pinhole array aperture can be specified by a pinhole diameter, by a pitch which specifies the distance between each pinhole in the array, and by a length, and the slit aperture can correspond to a pinhole array aperture having a pitch equal to zero. The pinhole diameter of both the pinhole array aperture and the slit aperture can have a size smaller than both a feature size of the aerial image and a wavelength of light generated by the illumination system.

The light blocking layer material, light blocking layer thickness, pinhole diameter, and material in the aperture space for the pinhole array aperture and for the slit aperture can be the same. For the pinhole array aperture, the light blocking layer thickness can be 100 nm, the pinhole diameter size can be 80 nm, the pitch can be 160 nm, and for the slit aperture, the light blocking layer thickness can be 100 nm, the pinhole diameter size can be 80 nm, the pitch can be 0 nm, and the ratio of the length of the pinhole array aperture to the length of the slit aperture can be about 18:5. The material in the aperture space for the pinhole array aperture and for the slit aperture can be SiO2 (silicon dioxide), and the material of the light blocking layer can be Ta (tantalum).

The light blocking layer can be formed on the detector. Alternatively, the light blocking layer can be formed on a SiO2 (silicon dioxide) substrate, and light transmitted through the first and second apertures can pass through the substrate to reach the detector. Additionally, a lens can be arranged between the substrate and the detector.

The polarization components can include a Transverse Electric (TE) polarization component and a Transverse Magnetic (TM) polarization component, wherein the pinhole array aperture and the slit aperture can have significantly different polarization properties, and wherein the pinhole array aperture can be used to transmit the TM polarization component and the TE polarization component, and the slit aperture can be used to transmit the TE polarization component.

Because the slit aperture and the pinhole array aperture can have significantly different polarization properties, the effects of noise on the samples obtained by the aerial image measuring device may be reduced, or substantially eliminated. Furthermore, manufacturing an aerial image measuring device having a slit aperture and a pinhole array aperture having significantly different polarization properties is not believed to be difficult to manufacture.

Image recovery can be performed by applying iterative calculations separately for each of the generated image profiles, wherein each iteration of image recovery includes calculating an original image profile for one of the polarization components of the aerial image using parameters of the optical lithography system; calculating a transmitted image profile for the polarization component that includes the effects of transmission through the aperture used to transmit the polarization component, by changing the original image profile using properties of aperture transmittance; comparing the transmitted image profile with the generated image profile for the polarization component to determine whether the generated image profile is substantially equal to the transmitted image profile; responsive to a determination that the generated image profile is substantially equal to the transmitted image profile, providing the calculated original image profile as the estimated image profile for the polarization component that excludes the effects of transmission through the aperture; and responsive to a determination that the generated image profile is not substantially equal to the transmitted image profile, deviating the initial parameters and beginning a next iteration of image recovery by calculating a new original image profile using the deviated parameters.

Because image recovery can be performed by applying iterative calculations separately for each of the generated image profiles, it may be possible to perform image recovery in an optical lithography system in which image formation is non-linear and governed by partially coherent imaging theory.

For the TE polarization component, the properties of aperture transmittance can include angular properties of transmittance through the slit aperture, and for the TM polarization component, the properties of aperture transmittance can include polarization change properties and angular properties of transmittance through the pinhole array aperture. The parameters of the optical lithography system can include the pattern on the reticle, lens aberrations, illumination conditions, and environmental conditions.

A more complete understanding of the disclosure can be obtained by reference to the following detailed description in connection with the attached drawings.

BRIEF DESCRIPTION OF THE DRAWINGS

FIG. 8A and FIG. 8B shows how an incident beam is scattered by a slit aperture.

It should be noted that for simplicity and for clarity of explanation, the figures are not necessarily drawn to scale.

DETAILED DESCRIPTION

Aerial Image Measurement

Figure 1:
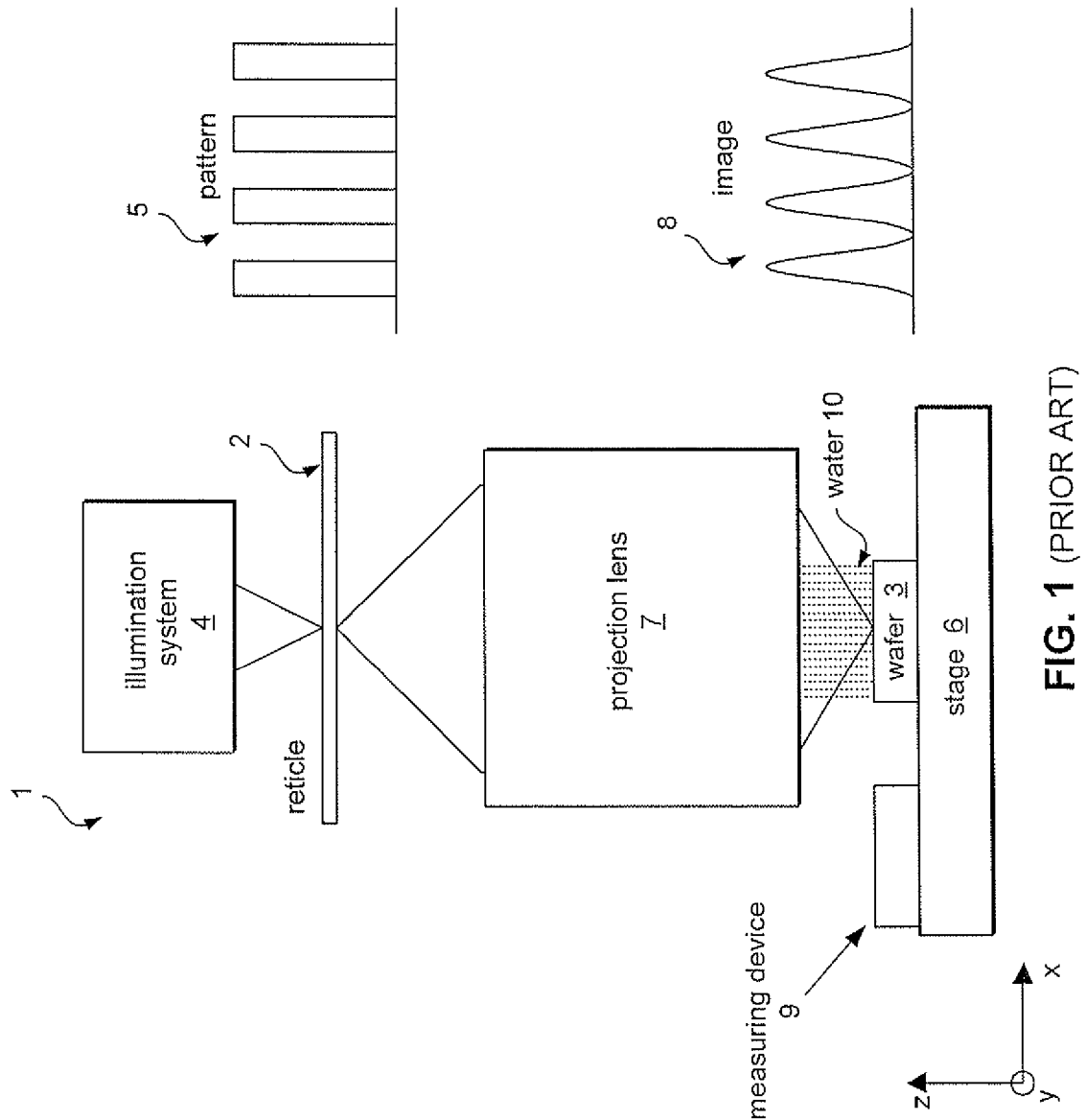
FIG. 1 shows the configuration of a typical optical lithography system used for the manufacturing of semiconductor devices.

As described above, FIG. 1 shows the configuration of a typical optical lithography system used for the manufacturing of semiconductor devices. An object pattern 5 on reticle 2 is projected onto wafer 3, where image 8 corresponding to object pattern 5 is created.

Advanced exposure systems typically employ "immersion technology" in which the space between the bottom lens element and a wafer is filled with liquid (typically pure water 10) to improve resolution. The resolution of system 1 is determined by a numerical aperture (NA) of projection lens 7 and an exposure wavelength ($\lambda$). The resolution is given by $R=k_1\lambda/NA$, where k1 is a process dependent factor usually between 0.3-0.5. An ArF excimer laser ($\lambda$=193 nm) is typically used for illumination by illumination system 4. Liquid used for an immersion system is transparent at the 193 nm wavelength and has a refractive index (n) larger than 1. Typically, purified water (n=1.44) is used as the liquid for an immersion system. However, a search for other liquids having larger values of n is in progress because the NA is enlarged by a factor of n (given by n×NA).

In typical optical lithography systems, the image quality is influenced by lens aberrations, illumination conditions, etc. The image quality can be evaluated, using a SEM (Scanning Electron Microscope), by exposing photo-resist coated on wafer 3 and developing the resist. To save time and to eliminate the influence of photo-resist properties, directly measuring aerial image 8 is favorable.

Figure 2:
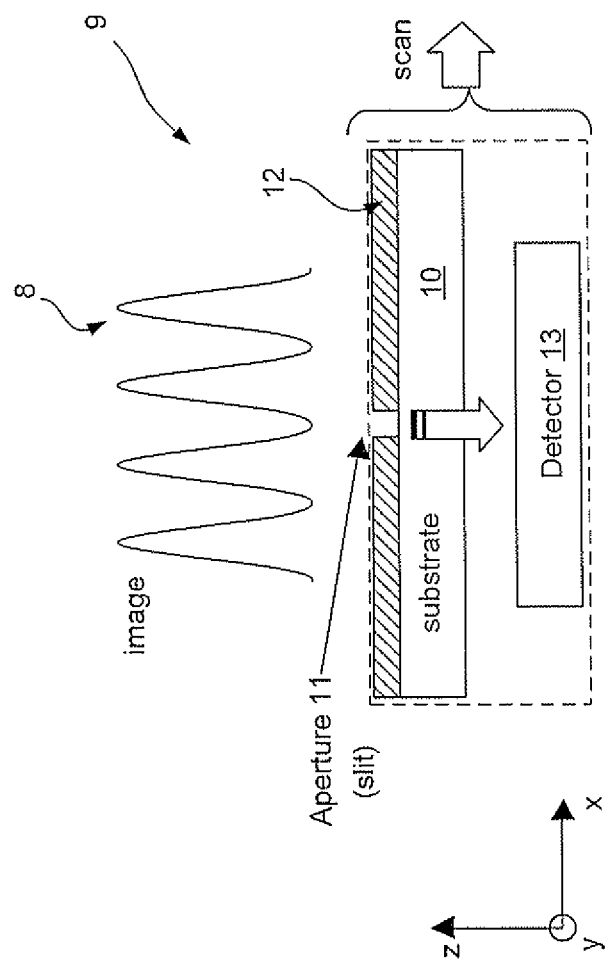
FIG. 2 shows the aerial image measuring device of FIG. 1 in more detail.

FIG. 2 shows the basic configuration of aerial image measuring apparatus 9 that is equipped on wafer stage 6. Device 9 includes light-blocking layer 12 formed on substrate 10. Light-blocking layer 12 has an aperture 11 through which light beams of a predetermined wavelength can pass. Light beams that compose aerial image 8 pass through aperture 11 and reach detector 13, which can measure the intensity of aerial image 8 at a given position. To measure the image intensity distribution of aerial image 8 along, for example, the x-axis, device 9 scans aerial image 8 in the x direction. These aerial image measurements can be used to create an aerial image profile, which can be used to evaluate the image quality of optical lithography system 1.

Figure 3:
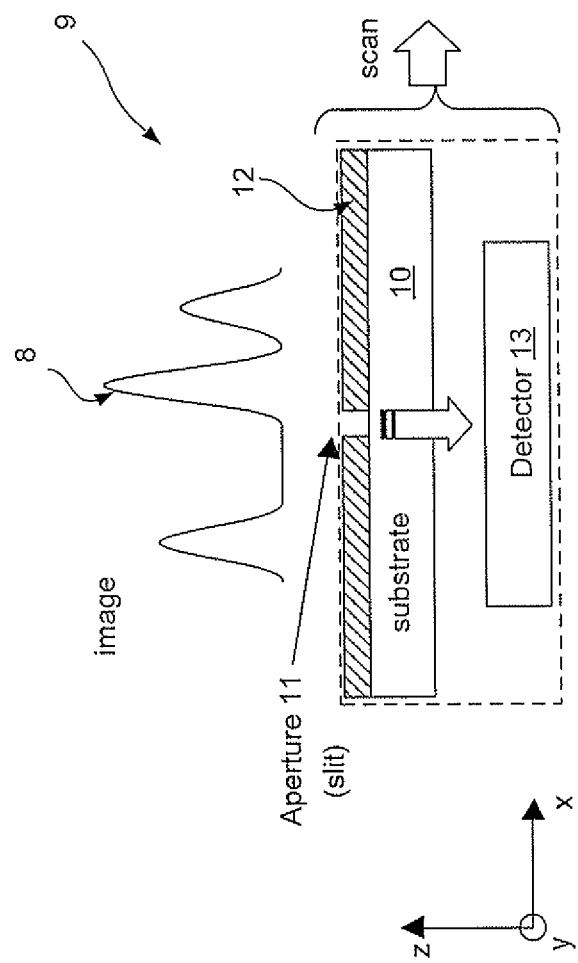
FIG. 3 shows the aerial image device of FIG. 1 measuring an image having an arbitrary intensity distribution that changes in the x direction.

For simplicity, image 8 and the aperture 11 are assumed to be one-dimensional (invariant in the y-direction). One-dimensional test patterns are actually widely used for the purpose of imaging performance evaluations. In FIG. 2, the image location is fixed, and the image intensity distribution is measured by scanning aperture 11 in the x-direction. Aperture 11 is assumed to be one-dimensional, which means its length in the y direction is substantially larger than that of the x direction. The scanning can be performed by properly controlling wafer stage 6. In order to realize high resolution in the measurement, the aperture width is sufficiently narrower than the image feature, which means that the aperture size is in the sub-wavelength region. When using a single aperture 11, the image does not need to be periodic, and an arbitrary intensity distribution that changes in the x direction can be measured as shown in FIG. 3.

Figure 4:
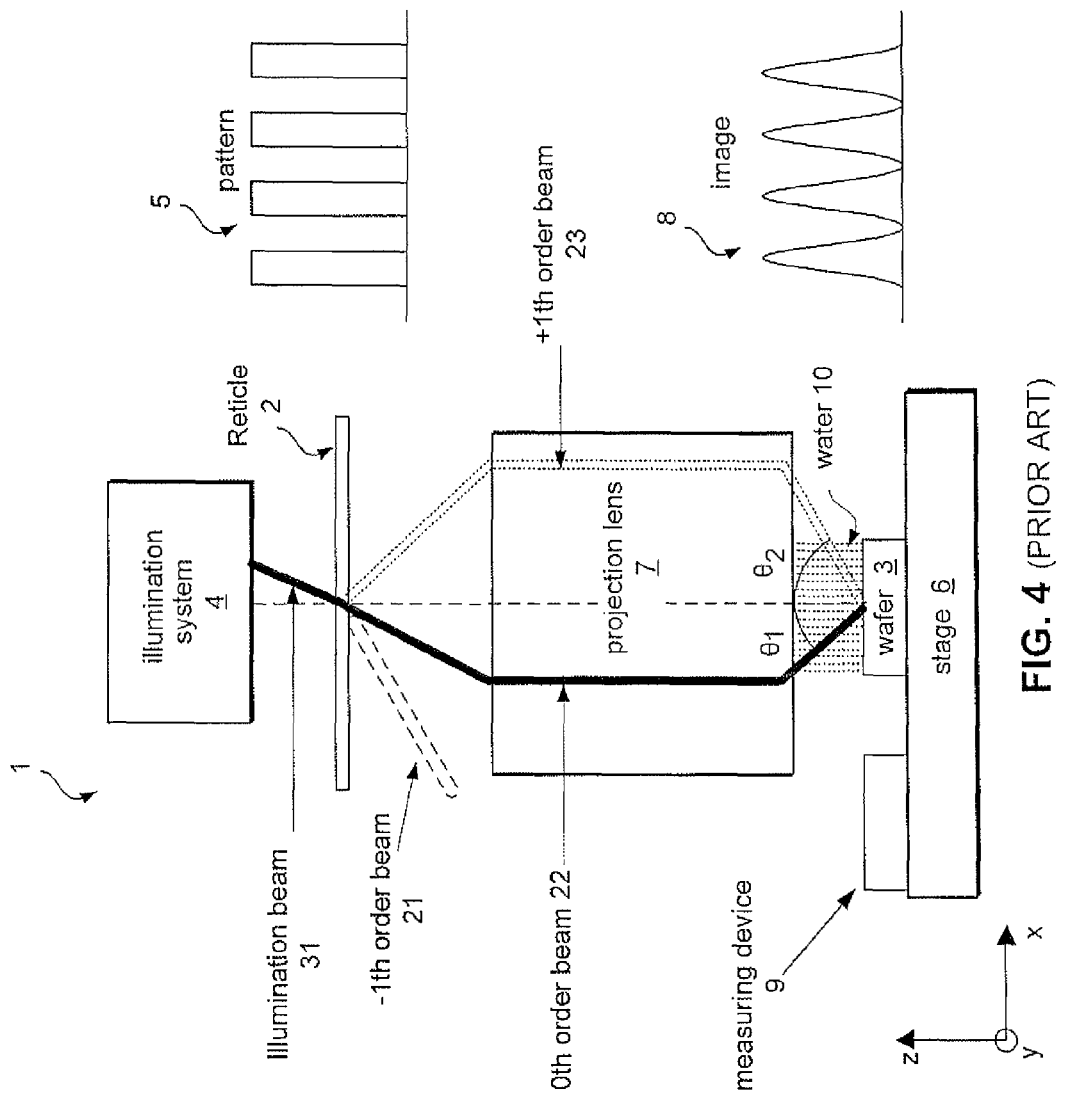
FIG. 4 shows light beams generated by the optical lithography system of FIG. 1.

The image formation of an optical lithography system is explained using FIG. 4. The illumination system is composed of plural source points. Each source point emits a plane wave to illuminate reticle 2. One beam (i.e., beam 31) obliquely incident on reticle 2 is depicted in FIG. 4. When a periodic pattern on reticle 2 is illuminated by a plane wave, diffraction beams with the orders of 0th, +1th, −1th, and higher are created. Then, only the orders captured by projection lens 7 and transferred to wafer 3 contribute to formation of image 8.

FIG. 4 shows a case in which image 8 is created by the 0th and the +1st order diffraction beams 22 and 23, respectively. When one source point is chosen, the illumination is called "coherent illumination", and when more than one source points are chosen, the illumination is called "partially coherent illumination". The imaging performance of the system is influenced by such a choice of illumination points, i.e., "illumination condition". Although the following explanations are made assuming a coherent illumination, its expansion to more general partially coherent illumination is straightforward.

Figure 5:
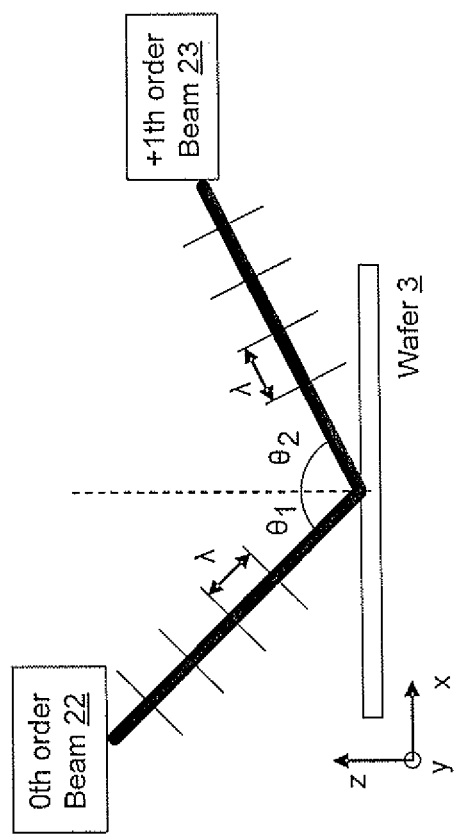
FIG. 5 shows light beams incident on the wafer of FIG. 1.

Each diffraction beam 22 and 23 can be modeled as a plane wave as shown in FIG. 5. The image intensity distribution is obtained by calculating interference between diffraction beams 22 and 23 on wafer 3. When the interference is calculated, polarization states of the beams are considered. The polarization state is determined by illumination system 4, and conserved in each diffraction beam. For the TE polarization, the electric field vector of the illumination beam is in the y direction, while the electric field vector is parallel to the xz plane for the TM polarization.

Figure 6:
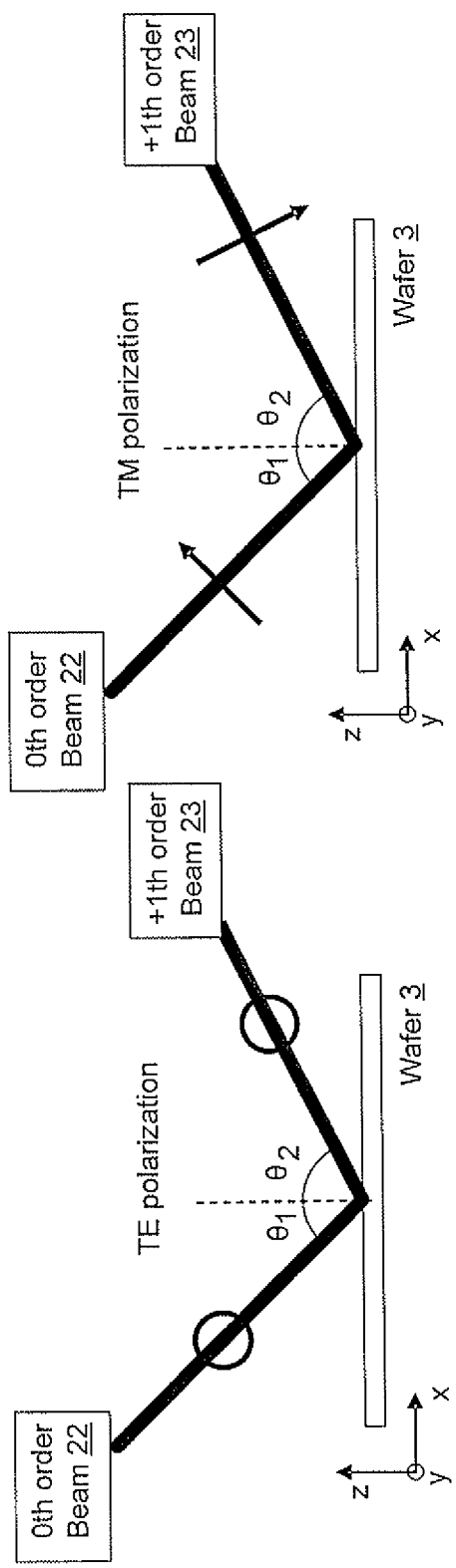
FIG. 6 shows the polarizations of light beams incident on the wafer of FIG. 1.

FIG. 6 shows polarization directions of beams 22 and 23 on wafer 3. The TE polarization has only the y component throughout the entire system, while the TM polarization lies in the xz plane, allowing the change of polarization direction associated with the change of the beam direction. Diffraction beams 22 and 23 all have the same polarization direction on the wafer for the TE polarization. On the other hand, each diffraction beam 22 and 23 has a different polarization direction for the TM polarization depending on its propagation direction. The polarization direction is always perpendicular to the beam propagation direction regardless of the polarization state.

When plural diffraction beams intersect with each other, interference occurs between polarization components that are parallel to each other. In case of the TE polarization, all beams have only the y component and the interference is calculated only using the y component. In case of the TM polarization, the polarization states of the intersecting beams need to be decomposed into the x and the z component, and the interference is calculated for the x and z components independently. Then, the image intensities created by the x and z components are added to obtain an image intensity distribution for the TM polarization.

Figure 7:
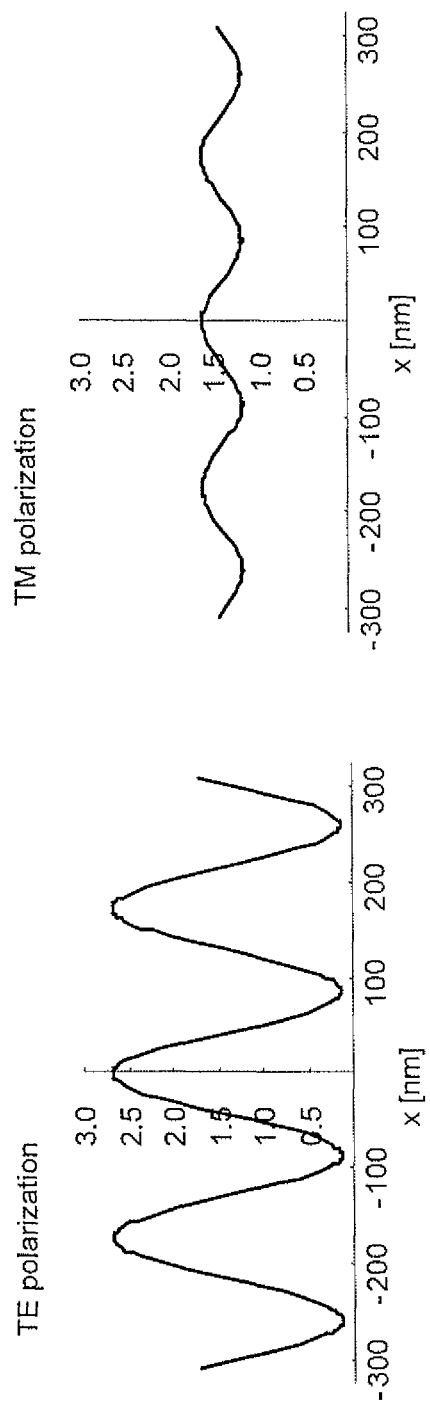
FIG. 7 shows an original aerial image profile.

For example, when $\theta_1=30°$ and $\theta_2=70°$ in FIG. 4, the image intensity distributions are given by FIG. 7, depending on the polarization state of the illumination beam 31. The conventional aerial image measurement technique measures such image profiles by scanning a narrow aperture on the wafer plane.

It is known that image profiles are changed when images on a wafer are transmitted through a narrow aperture. FIGS. 8A, 8B, 9, 10 and 11 are used to explain the mechanism of image profile change. FIGS. 8A and 8B show how an incident beam is scattered by a slit (e.g., aperture 11). In FIG. 8A, the slit width is sufficiently small compared with the wavelength, and the slit acts like a secondary point source leading to symmetrical scattering with respect to the z axis. In FIG. 8B, the slit width is not so small, leading to unsymmetrical scattered beam distribution. When the slit width is not sufficiently small, the slit may not resolve minute structures in an image that is being measured.

Figure 9:
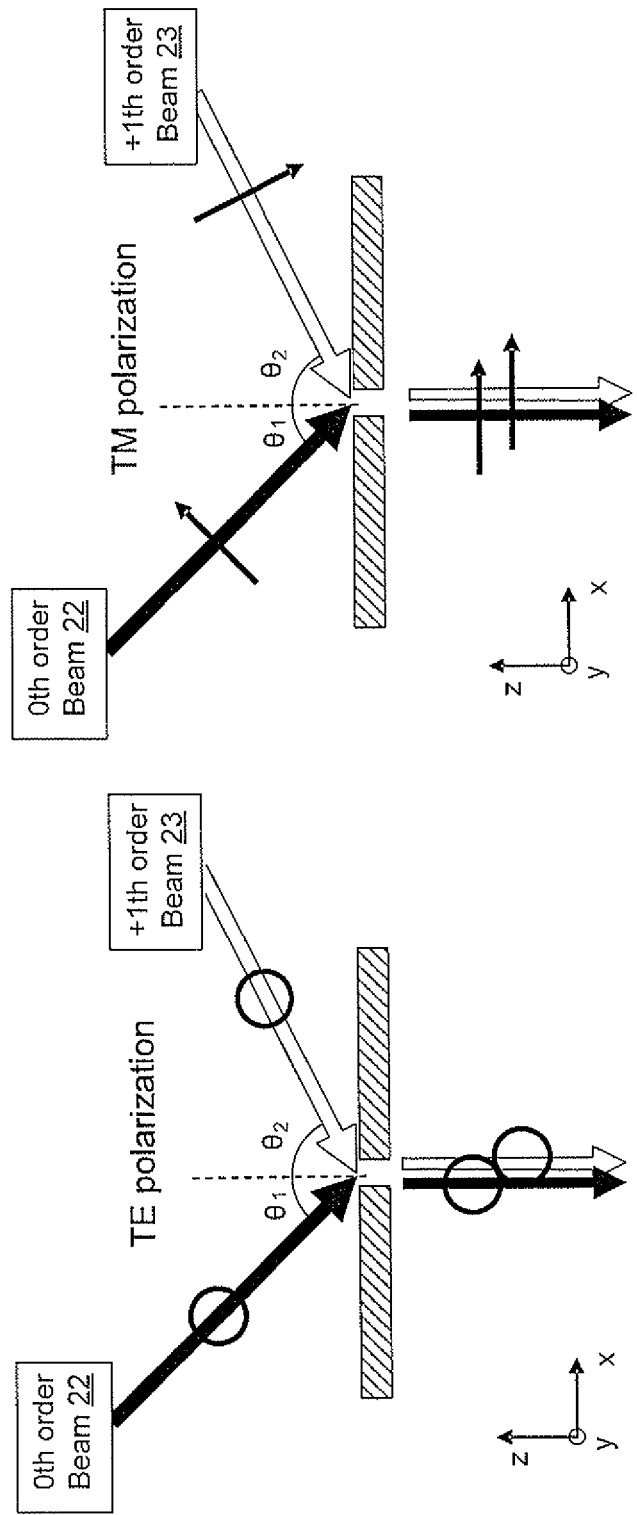
FIG. 9 shows how the propagation directions of diffraction beams are changed through slit transmission.

The resolution is determined by the slit width in an aerial image measurement system. Therefore, for a slit used for aerial image measurement, it is preferred that the width be small enough so that the scattering is described by FIG. 8A. As a result, as shown in FIG. 9, the propagation directions of the diffraction beams are substantially changed through the slit transmission. Independent of the incident angle to the slit, the exiting beams are regarded to be parallel to each other. The TE polarization case is still described by the y component. However, significant polarization property change occurs for the TM polarization, which is described by one polarization component (x component) after the slit transmission.

Figure 10:
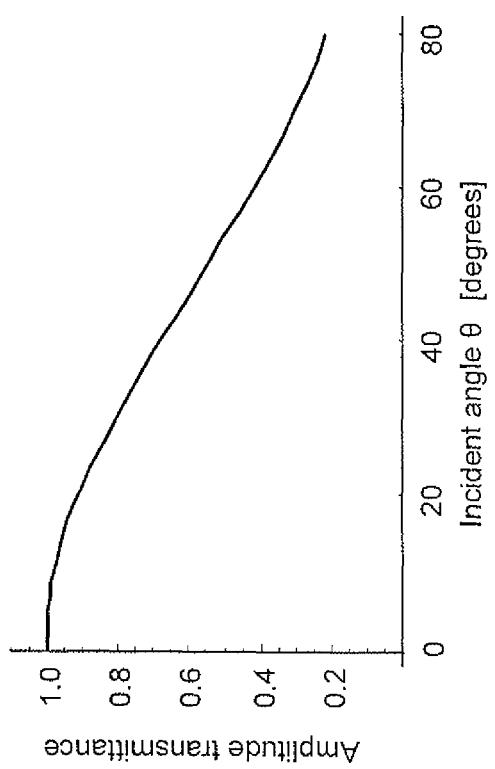
FIG. 10 shows the relation between the beam incident angle and the amplitude transmittance of the slit aperture.

In addition to the change of polarization state mentioned above, the amplitude of each diffraction beam (e.g., 22 and 23) is non-uniformly decreased depending on the incident angle (e.g., $\theta_1$ and $\theta_2$). When amplitude transmittance is normalized by a value at normal incidence, FIG. 10 shows a typical behavior of angular dependence. In many cases, it is confirmed that the TE and TM polarizations have substantially identical distribution curves, although the values of transmittance differ from each other. The image profiles measured by slit transmission can be calculated by considering the above two factors, i.e. the change of polarization state and the amplitude decrease depending on the beam direction (incident angle to a slit). As a result of the above effects, the distributions of FIG. 7 (original image profile) are changed to the distributions of FIG. 11 (transmitted image profile).

Figure 11:
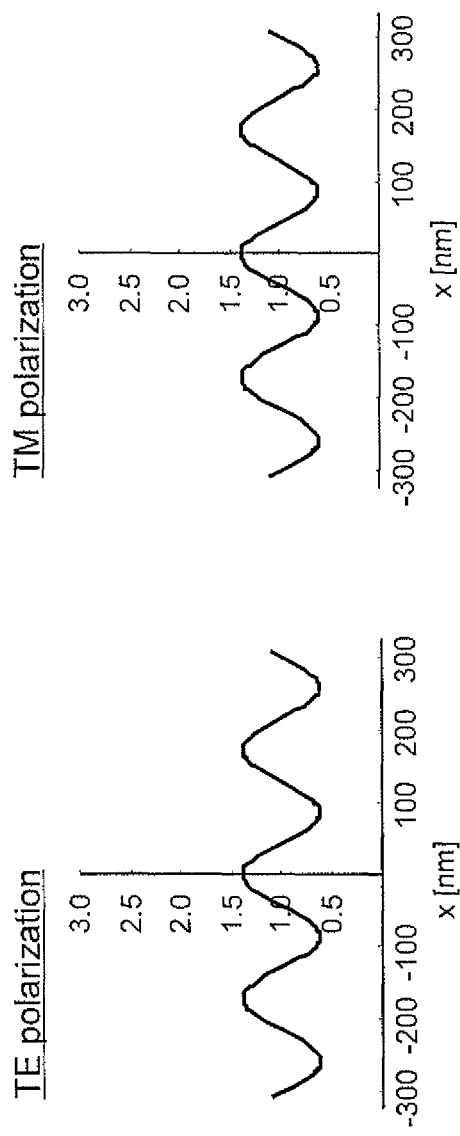
FIG. 11 shows an aerial image profile after transmission through a slit.

Significant problems with conventional aerial image measurement techniques exist. Firstly, the image profiles shown in FIG. 11 are quite different from the image profiles of FIG. 7. For accurate measurement of aerial images, a process of image recovery from FIG. 11 to FIG. 7 is used in the example embodiments. In considering such an image recovery process, the second problem is that the mechanism of image profile change is different between the TE and TM polarizations. This fact suggests that image recovery will be possible only when the measured aerial image has either the TE or the TM polarization component. When measured aerial images have both the TE and TM components, such a recovery process may not be possible without separating each polarization component.

In an optical lithography system, the illumination polarization is not simply specified by the TE or the TM state, but rather represented by a mixture of the two states. An aerial image (e.g., 8) on a wafer (e.g., 3) is composed of both polarization components, and the information regarding polarization is unknown.

Therefore, the present disclosure proposes separating the two polarization components of aerial image measurement, in addition to determining image profiles.

To separately measure the TE and the TM image components, one method would be to insert a polarizer that transmits only the TE or only the TM component. A polarizer can be inserted on either side (top or bottom) of a slit (e.g., 11) to select the polarization state that reaches a detector (e.g. 13).

However, the problem is that a compact sized polarizer that can be inserted into a measurement system and that works at 193 nm of ArF laser does not exist, and is expected to be very hard to realize.

First Embodiment

Figure 12:
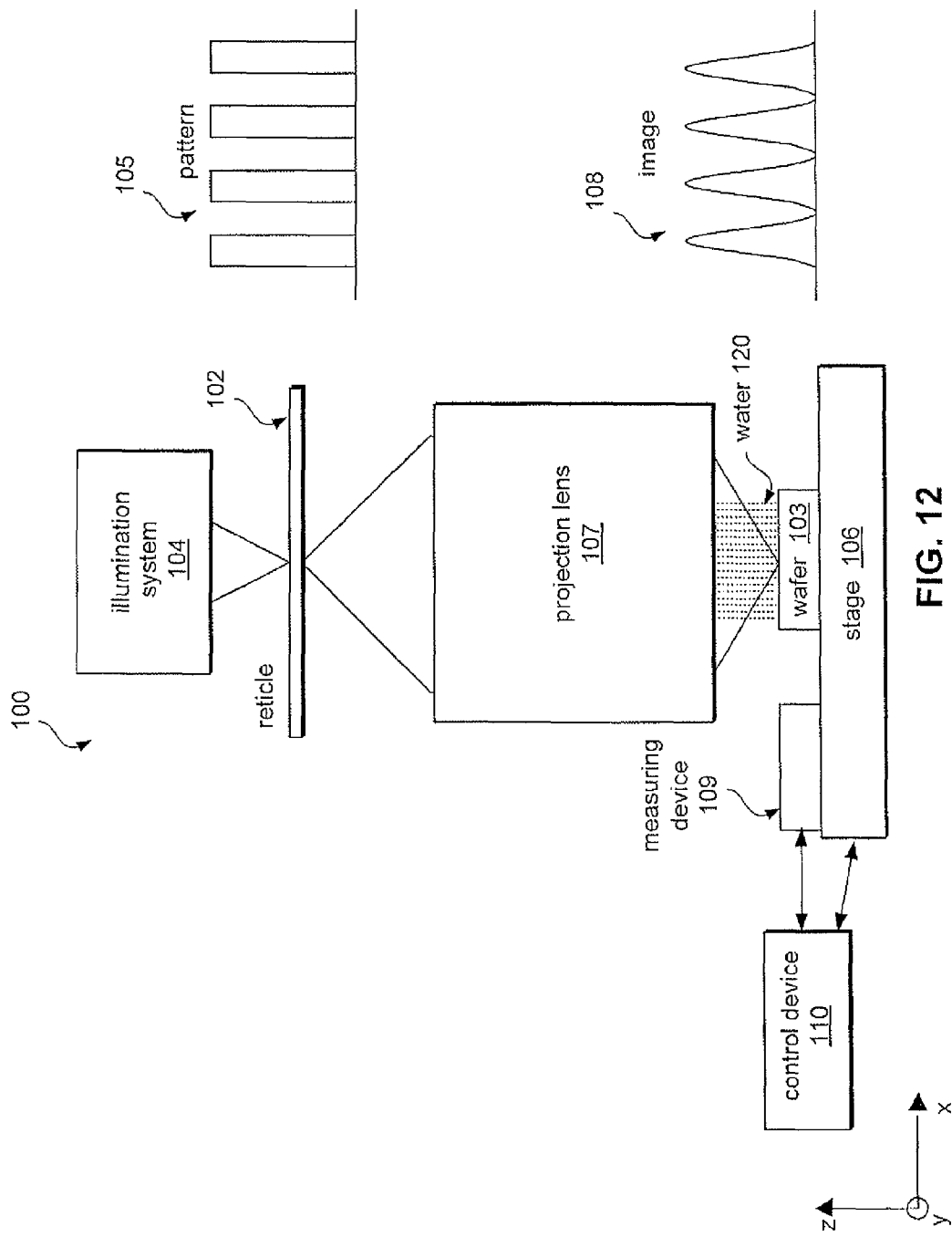
FIG. 12 shows the configuration of an optical lithography system according to a first example embodiment.

FIG. 12 shows the configuration of an optical lithography system 100 used for the manufacturing of semiconductor devices according to a first example embodiment. A wafer 103 is positioned on wafer stage 106, and illumination system 104 illuminates a pattern 105 on reticle 102 thereby generating light beams that are projected onto the wafer 103 by the projection lens 107 to create an image 108 corresponding to the pattern 105. The space between lens 107 and wafer 103 (or measuring device 109) is filled with water 120 to improve resolution. Illumination system 104 uses one or more illumination source points to generate beams that form the image 108 projected onto wafer 103.

Measuring device 109 has a light detector and a light blocking layer for separating polarization components of light incident thereon. The light blocking layer has an $\alpha$ aperture and a $\beta$ aperture. These two apertures are structured differently from each other, and have significantly different polarization properties. The different structures transmit at least one of the polarization components differently, and the detector provides separate samples for light transmitted through the first and second apertures.

In the first example embodiment, the polarization components include a Transverse Electric (TE) polarization component and a Transverse Magnetic (TM) polarization component. The $\alpha$ aperture is used to transmit the TE polarization component, and the $\beta$ aperture is used to transmit the TM polarization component and the TE polarization component.

In the first example embodiment, control device 110 is a general purpose computer coupled to measuring device 109 and wafer stage 106. Control device 110 controls measuring device 109 and wafer stage 106. Control device 110 controls wafer stage 6 to move so that aerial image 108 is scanned by measuring device 109. Control device 110 executes program instructions for performing a process for measuring image 108 using measuring device 109.

In other embodiments, control device 110 can control measuring device 109, and anther control device can control wafer stage 106. In other embodiments, control device 110 can be control circuitry included in measuring device 109 and/or wafer stage 106.

Control device 110 includes a processor coupled to a memory via a system bus. The processor is also coupled to external Input/Output (I/O) devices via the system bus and an I/O bus. A storage device having computer-readable media is coupled to the processor via a storage device controller and the I/O bus and the system bus. The storage device is used by the processor to store and read data and program instructions used to perform the aerial image measuring process to be described below in the description of FIGS. 20, 25 and 26.

Control device 110's processor is further coupled to a user output device for outputting results of the aerial image measuring process to a user. Example user output devices include displays, printers, lights, speakers, or any other device that outputs information to a user. The output device is coupled to the processor via a user output device controller coupled to the I/O bus. The controller's processor may be further coupled to a user input device via a user input device controller coupled to the I/O bus.

The controller's processor may be further coupled to a communications device via a communications device controller coupled to the I/O bus. The controller's processor may use the controller's communications device to communicate with wafer stage 106 for controlling wafer stage 106 to scan image 108 with measuring device 109. The controller's processor may use the communications device to communicate with measuring device 109 to receive measurements from measuring device 109.

In operation, the controller's processor loads the controller's program instructions from the storage device into the controller's memory. The controller's processor executes the loaded program instructions to implement the aerial image measuring process to be described below.

Figure 13:
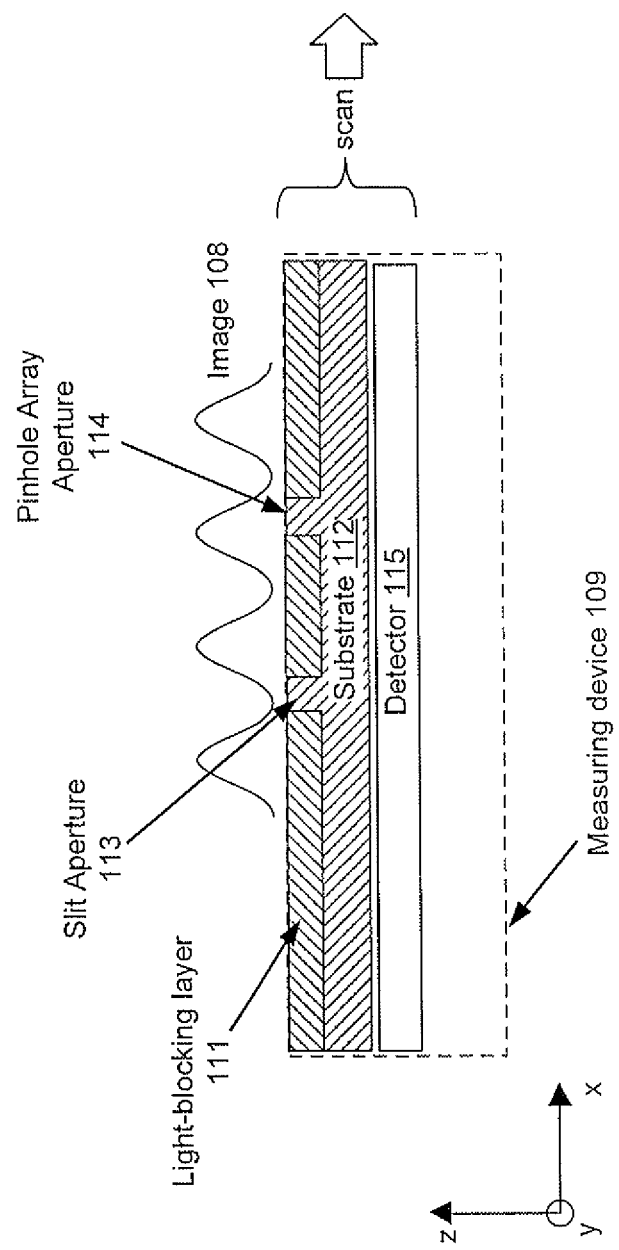
FIG. 13 is a detailed view of the measuring device of FIG. 12.

FIG. 13 shows measuring device 109 in more detail. FIG. 13 is a cross-sectional view of measuring device 109, according to the first example embodiment. Aperture 113 is a slit aperture (α aperture), and aperture 114 is a pinhole array aperture (β aperture).

In other embodiments, the pair of apertures 113 and 114 can include pair of slit apertures, a pair of pinhole array apertures, or any other pair of apertures having different polarization properties.

As shown in FIG. 13, light blocking layer 111 is formed on SiO2 (silicon dioxide) substrate 112, and light transmitted through slit aperture 113 and pinhole array aperture 114 passes through substrate 112 to reach detector 115.

The signal from slit aperture 113 and the signal from pinhole array aperture 114 are measured independently from each other, and detector 115 provides separate samples for light transmitted through slit aperture 113 and for light transmitted through pinhole array aperture 114. Detector 115 is a 2-dimensional imaging device, such as, for example, a CCD (Charged-Coupled Device) or a CMOS (Complementary Metal-Oxide-Semiconductor) sensor.

Figure 14:
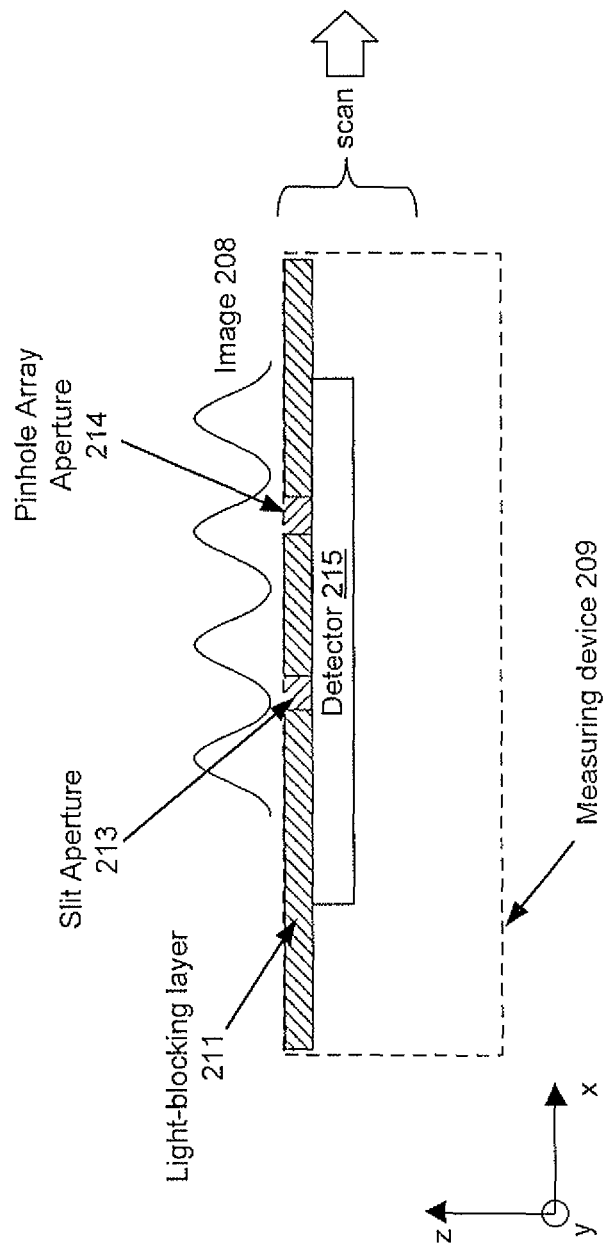
FIG. 14 is a cross-sectional view of a measuring device in which the light-blocking layer is formed on the detector, according to another example embodiment.

FIG. 14 is a cross-sectional view of a measuring device 209 in which the light-blocking layer is formed on the detector, according to another example embodiment. Aperture 213 is a slit aperture (α aperture), and aperture 214 is a pinhole array aperture (β aperture). Light blocking layer 211 is formed on detector 215, and light transmitted through slit aperture 213 and pinhole array aperture 214 reaches detector 215.

Figure 15:
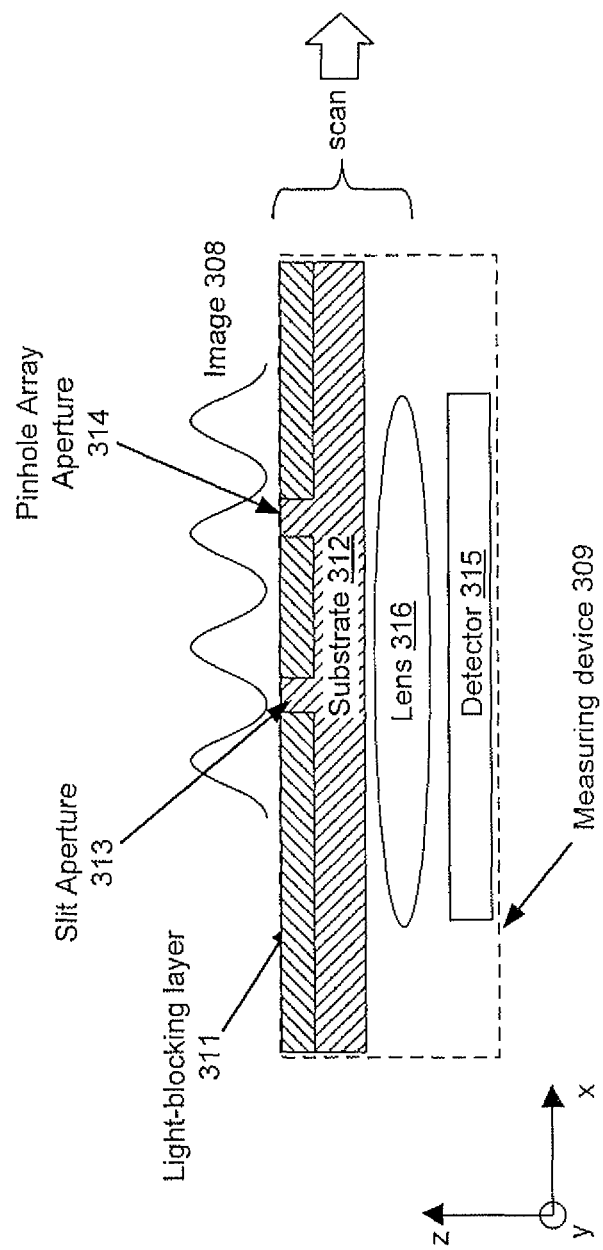
FIG. 15 is a cross-sectional view of a measuring device in which a lens is arranged between the substrate and the detector, according to another example embodiment.

FIG. 15 is a cross-sectional view of a measuring device 309, according to another example embodiment. Aperture 313 is a slit aperture (α aperture), and aperture 314 is a pinhole array aperture (β aperture). As shown in FIG. 15, light blocking layer 311 is formed on SiO2 (silicon dioxide) substrate 312, and lens 316 is arranged between substrate 312 and detector 315. Light transmitted through slit aperture 313 and pinhole array aperture 314 passes through substrate 312 and lens 316 to reach detector 315.

Figure 16:
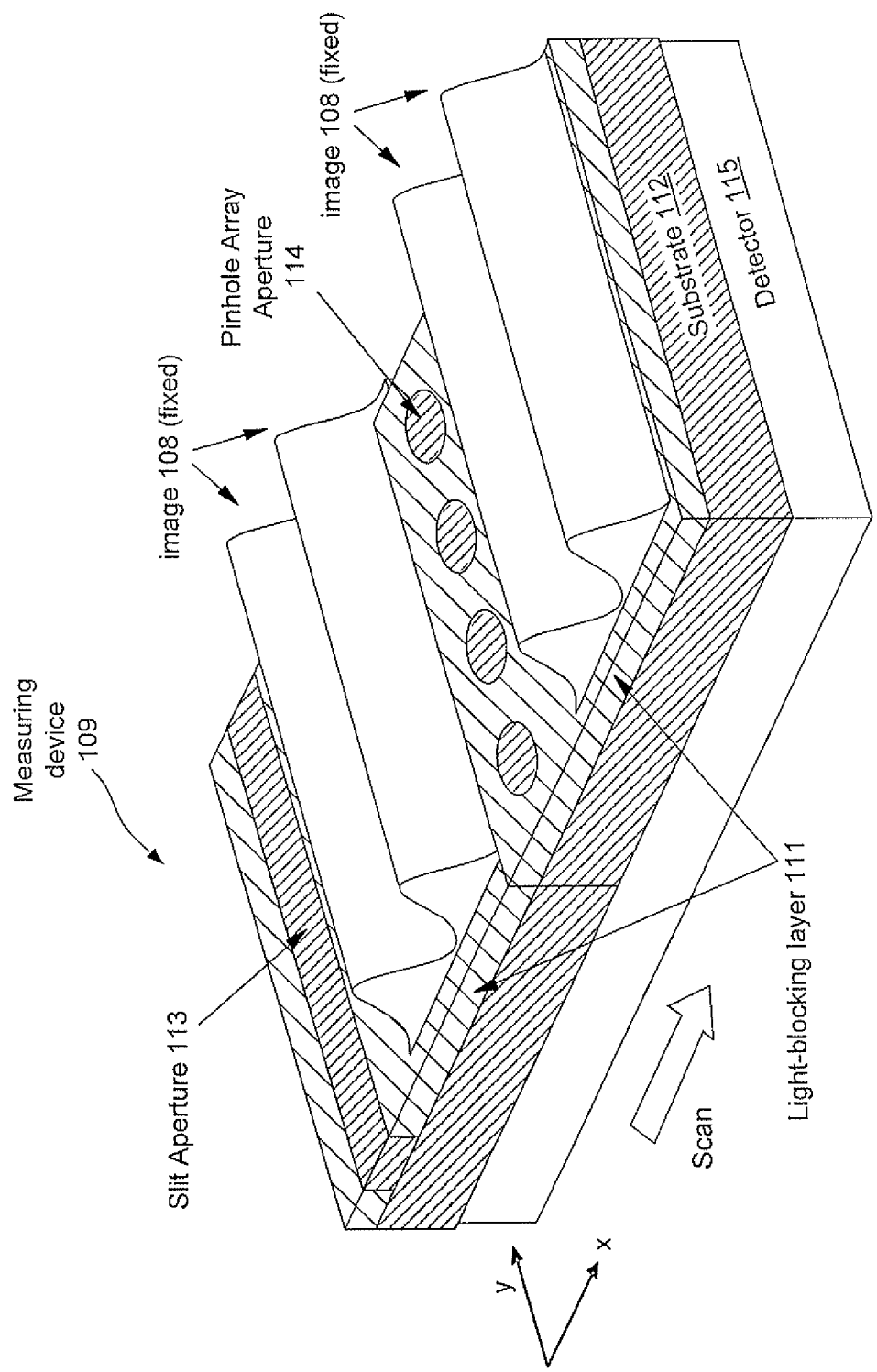
FIG. 16 is a view of a portion of the measuring device of FIG. 12 that shows a top view of the slit aperture and the pinhole array aperture.
Figure 17:
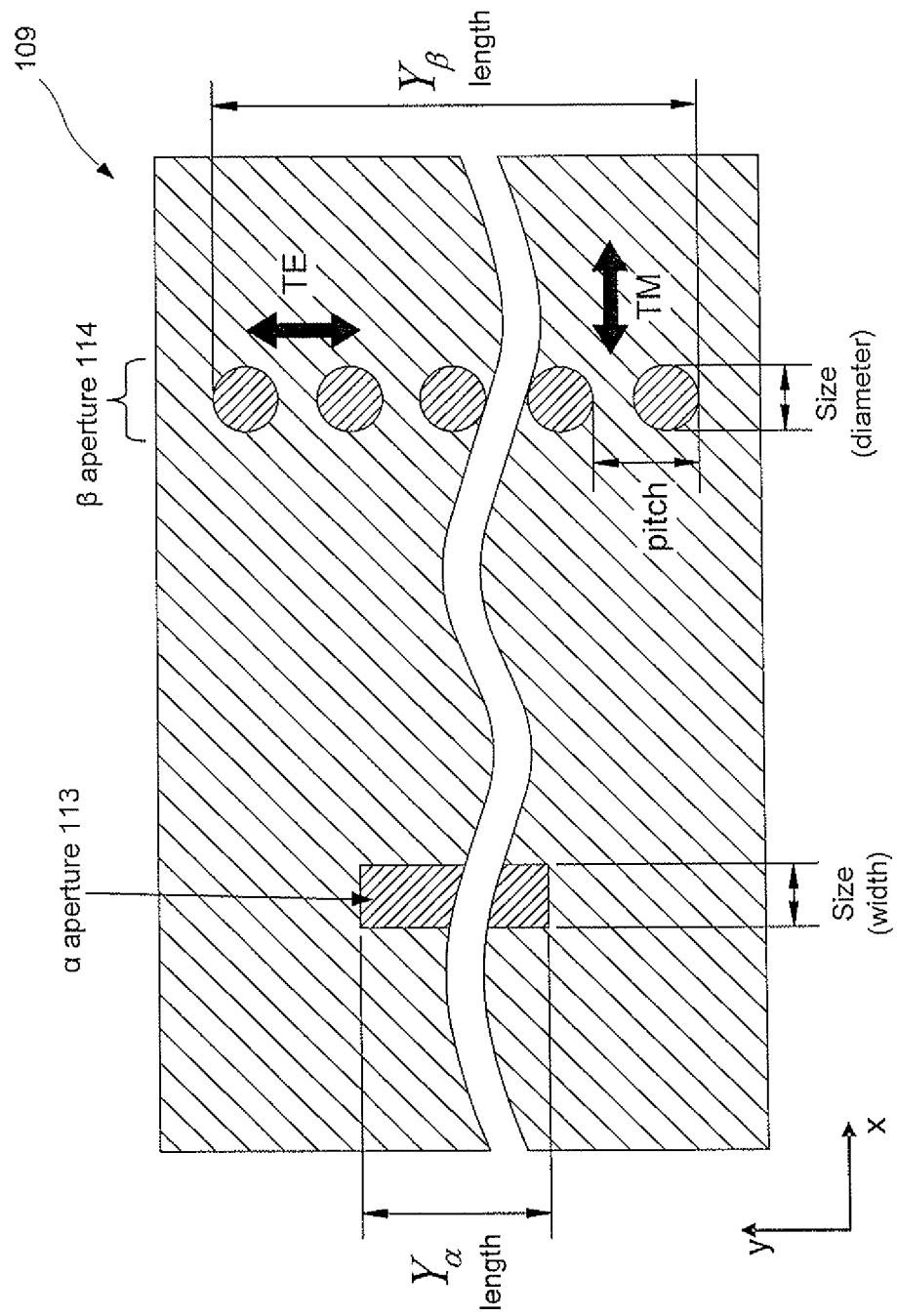
FIG. 17 shows a top view of the measuring device of FIG. 12.

FIG. 16 is a view of a portion of measuring device 109 that shows a top view of slit aperture 113 and pinhole array aperture 114. The size and the polarization direction with respect to the aperture direction are specified in FIG. 17, which shows a top view of measuring device 109. The pinhole array aperture 114 is specified by pinhole size and pitch. The limit of pitch zero for a pinhole array is equivalent to a slit. The length of each aperture is measured in the y direction, and the lengths for the slit and pinhole array apertures are represented by $Y_\alpha$ and $Y_\beta$, respectively.

The sizes of both pinhole array aperture 114 and slit aperture 113 are smaller than both a feature size of the aerial image and a wavelength of light generated by illumination system 104. The light blocking layer material, light blocking layer thickness, size, and material in the aperture space for pinhole array aperture 114 and for slit aperture 113 are the same. In other embodiments, apertures 113 and 114 can have different sizes as long as the pair of apertures exhibit substantially identical angular transmission properties, as shown in FIG. 21B and FIG. 22B. Also, in other embodiments, different materials and/or different thicknesses may be chosen for light-blocking layer 111, as long as the pair of apertures exhibit substantially identical angular transmission properties, as shown in FIG. 21B and FIG. 22B.

Figure 18:
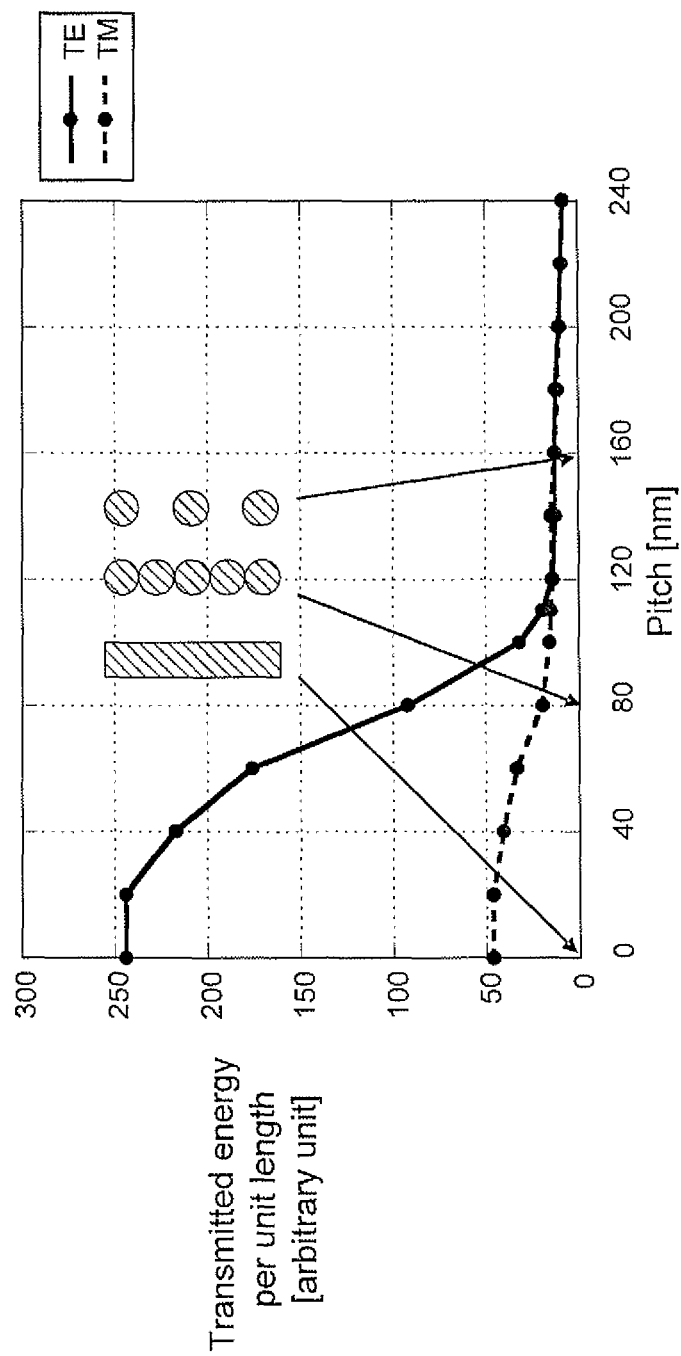
FIG. 18 shows the change of transmitted energy from the apertures for the TE and TM polarizations when the pitch of the apertures is changed, according to example embodiments.

FIG. 18 shows the change of transmitted energy from the apertures for the TE and TM polarizations when the pitch is changed. The incident beam is assumed to be vertically incident on a light blocking layer, i.e., in the z direction. The longitudinal axis of FIG. 18 represents the amount of energy that transmits through the aperture per a unit length. When the pitch is increased, it is seen that the polarization dependence disappears at a certain pitch (about 120 nm).

Figure 19:
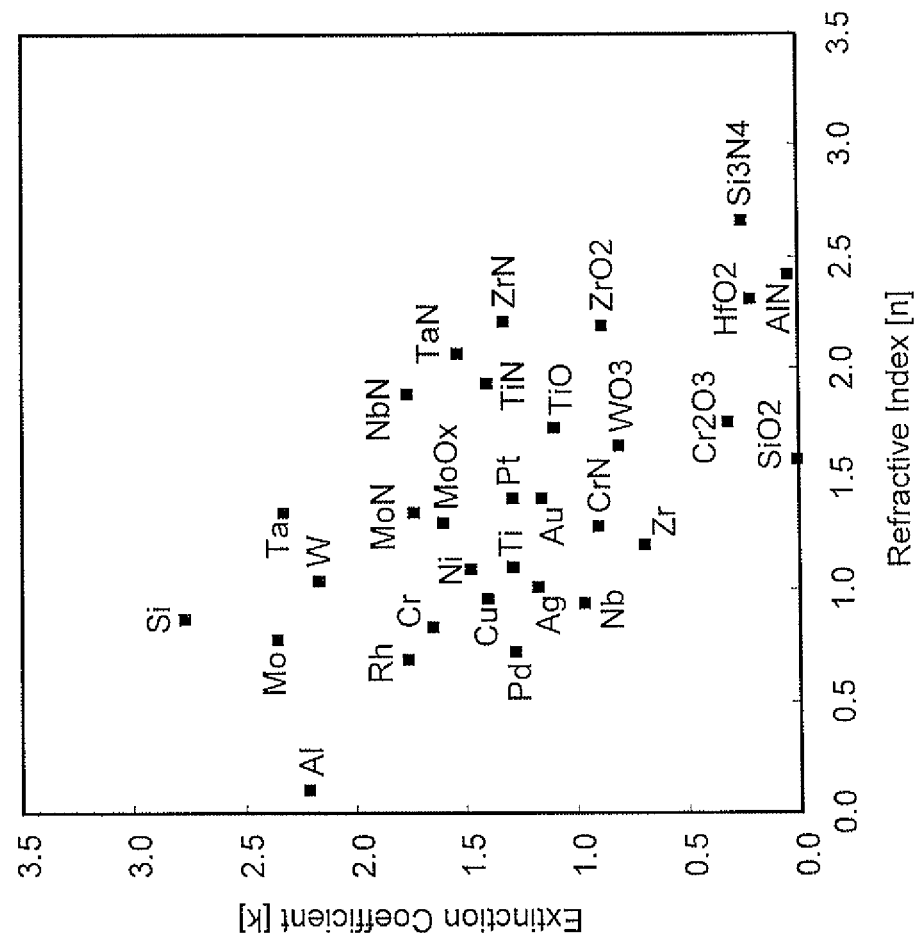
FIG. 19 shows optical properties of typical materials that can be used for the light-blocking layer of a measuring device, according to example embodiments.

In the first example embodiment, for pinhole array aperture 114, the light blocking layer thickness is 100 nm, the size (pinhole diameter) is 80 nm, the pitch is 160 nm, and the length is 35.6 μm, and for slit aperture 113, the light blocking layer thickness is 100 nm, the size (width) is 80 nm, the pitch is 0 nm, and the length is 10 μm. In other embodiments, the pinhole array aperture and the slit apertures can have different dimensions. The material in the aperture space for pinhole array aperture 114 and for slit aperture 113 is SiO2 (silicon dioxide), and the material of the light blocking layer is Ta (tantalum). In other embodiments, other materials can be used for light-blocking layer 111, such that the pair of apertures formed by the light-blocking layer exhibit substantially identical angular transmission properties, a shown in FIGS. 21B and 22B. Examples of other materials for light-blocking layer 111 include Si, Mo, W, and Cr. FIG. 19 shows optical properties of typical materials that can be used for light-blocking layer 111 for light having a wavelength of 193 nm. Optical properties of each material are specified by refractive index "n" and extinction coefficient "k".

$\alpha_{TE}$ and $\alpha_{TM}$ represent the transmittance of the α aperture for the TE and TM polarizations, respectively. $\beta_{TE}$ and $\beta_{TM}$ represent the transmittance of the β aperture for the TE and TM polarizations, respectively. In the first example embodiment, these values are as follows:

$$\begin{cases} \alpha_{TE} = 243.8 \\ \alpha_{TM} = 46.3 \\ \beta_{TE} = 13.0 \\ \beta_{TM} = 13.0 \end{cases} \quad (1)$$

The ratios between the values for $\alpha_{TE}$, $\alpha_{TM}$, $\beta_{TE}$ and $\beta_{TM}$ have physical meanings because these values are represented in an arbitrary unit.

Figure 20:
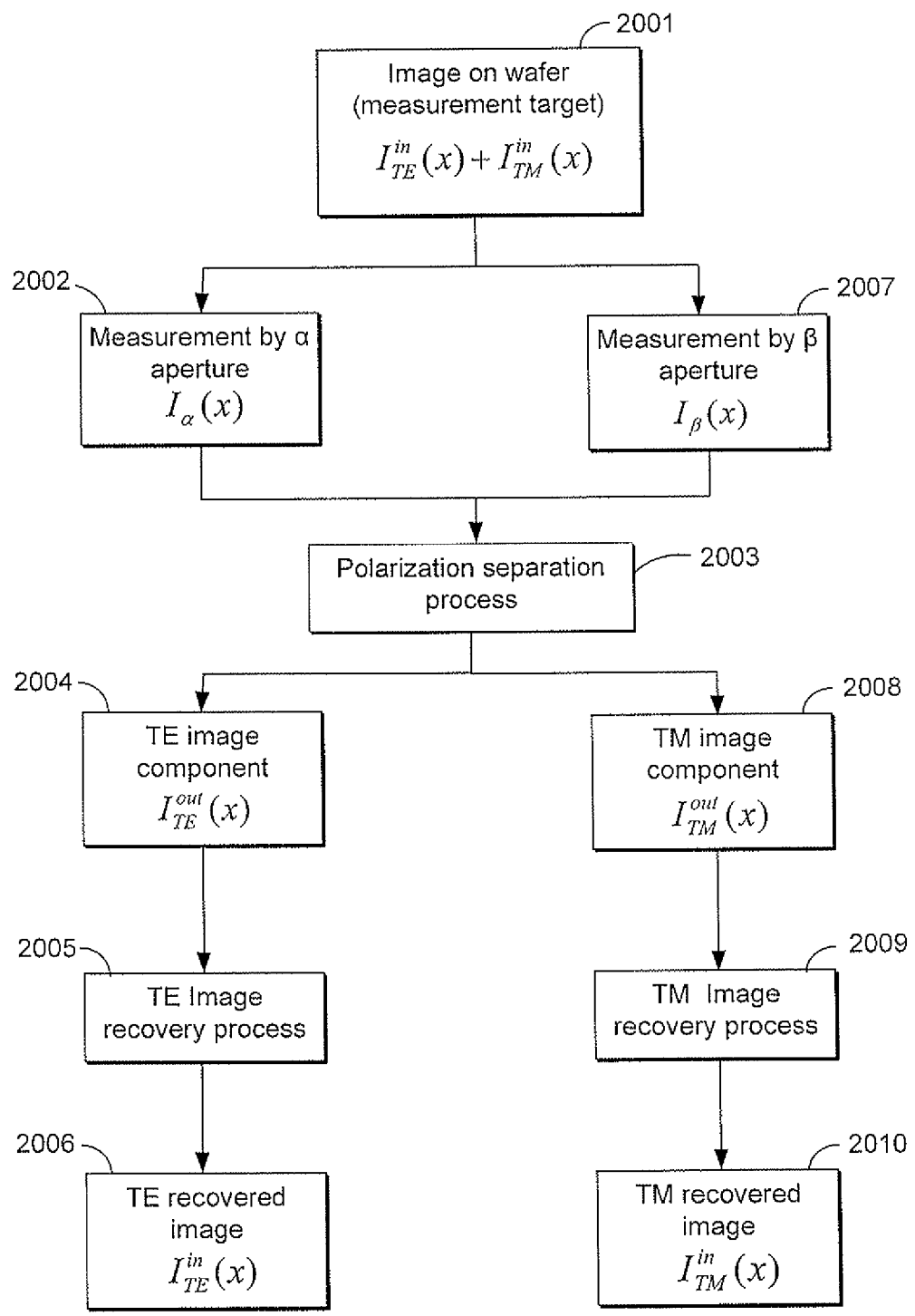
FIG. 20 is a flow diagram illustrating a process for measuring an aerial image, according to the first example embodiment.

FIG. 20 is a flow diagram illustrating a process for measuring image 108, according to the first example embodiment. At block 2001, control device 110 controls wafer stage 106 to move so that measuring device 109 scans image 108 ($I_{TE}^{in}(x)+I_{TM}^{in}(x)$). At block 2002, control device 110 receives measurement samples for light transmitted through α aperture 113 ($I_\alpha(x)$), provided by detector 115. At block 2007, control device 110 receives measurement samples for light transmitted through β aperture 114 ($I_\beta(x)$), provided by detector 115.

At block 2003, controller device 110 performs a polarization separation process. During this polarization process, controller device 110 generates separate image profiles for each polarization component of the aerial image using the samples provided by the detector of measuring device 109.

More specifically, controller device 110 generates an image profile for the TE component ($I_{TE}^{out}(x)$) at block 2004, and generates an image profile for the TM component ($I_{TM}^{out}(x)$) at block 2008.

At block 2005, controller device 110 performs an image recovery process to generate an estimated image profile for the TE polarization component of image 108. The estimated image profile ($I_{TE}^{in}(x)$) obtained at block 2006 excludes the effects of transmission through the α aperture. At block 2009, controller device 110 performs an image recovery process to generate an estimated image profile for the TM polarization component of image 108. The estimated image profile ($I_{TM}^{in}(x)$) obtained at block 2510 excludes the effects of transmission through the β aperture.

A more detailed description of the polarization separation process of block 2003 follows. Image 108 (the image on a wafer) is represented by $I_{TE}^{in}(x) + I_{TM}^{in}(x)$ as a combination of the TE and the TM components. The TE and TM image components are to be separately obtained so that image recovery, which eliminates the influence of aperture transmission, is possible. Through transmission of the α aperture, the following changes are assumed:

$$\begin{cases} I_{TE}^{in}(x) \rightarrow \alpha_{TE} I_{TE}^{out}(x) \\ I_{TM}^{in}(x) \rightarrow \alpha_{TM} I_{TM}^{out}(x) \end{cases} \quad (2)$$

Similarly, through transmission of the β aperture, the following changes are assumed:

$$\begin{cases} I_{TE}^{in}(x) \rightarrow \beta_{TE} I_{TE}^{out}(x) \\ I_{TM}^{in}(x) \rightarrow \beta_{TM} I_{TM}^{out}(x) \end{cases} \quad (3)$$

In aperture transmission, the image intensity is affected by the parameters of $\alpha_{TE}$, $\alpha_{TM}$, $\beta_{TE}$, and $\beta_{TM}$. $\alpha_{TE}$ and $\alpha_{TM}$ represent the transmittance of the α aperture for the TE and TM polarizations, respectively. $\beta_{TE}$ and $\beta_{TM}$ represent the transmittance of the β aperture for the TE and TM polarizations, respectively. In addition, the image profile is changed by aperture transmission. Equations (2) and (3) assume that the change of image profile is common between the two apertures. This assumption is valid when the two apertures have the same properties in terms of incident angle dependence.

Figure 21A:
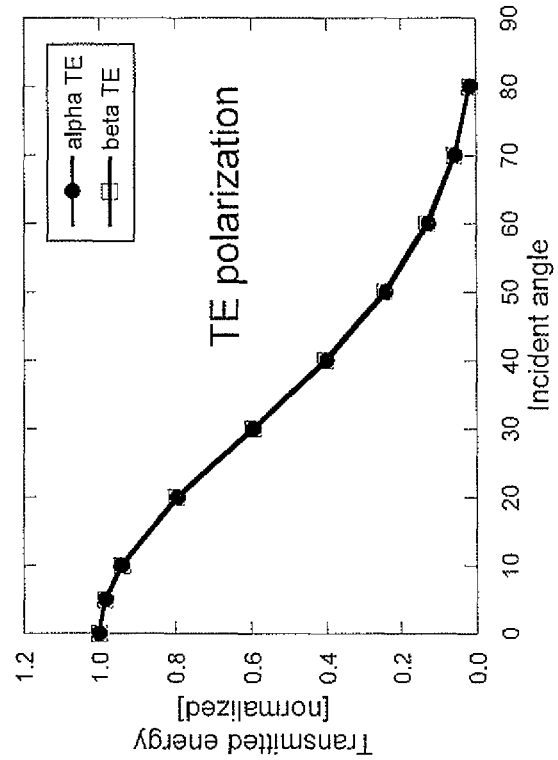
FIGS. 21A and 21B show TE polarization angular transmission properties for the measuring device of FIG. 12.
Figure 21B:
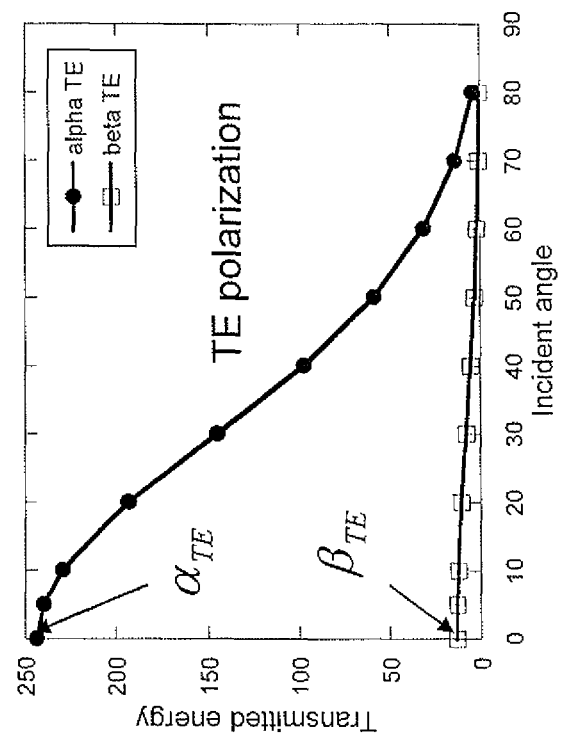
Figure 22B:
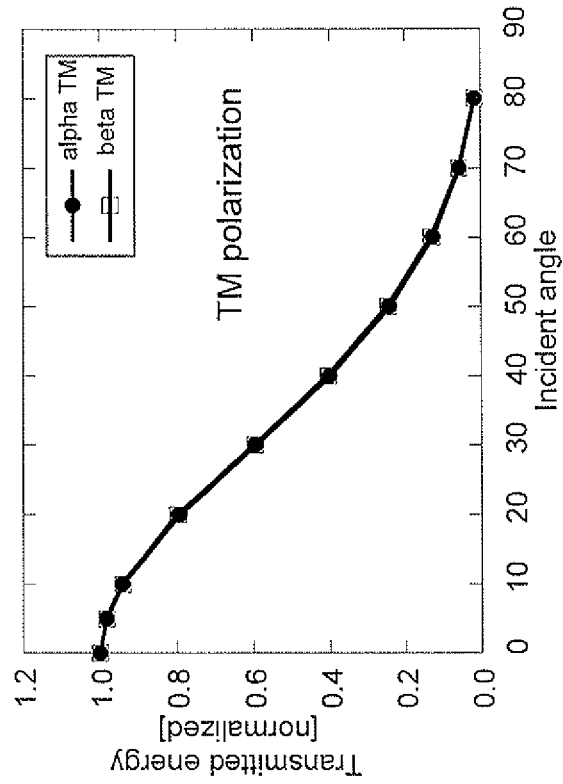
FIGS. 22A and 22B show TM polarization angular transmission properties for the measuring device of FIG. 12.

FIGS. 21A and 21B show the TE polarization case. As shown in FIG. 21A, the value for are $\alpha_{TE}$ and $\beta_{TE}$ specified in Equations (1) are values for a 0 degree incident angle. By normalizing the curves by $\alpha_{TE}$ and $\beta_{TE}$, respectively, FIG. 21B is obtained. Although the value of transmitted energy is different between the apertures, it is seen that the two apertures have the same properties in terms of dependence on the incident angle.

Figure 22A:
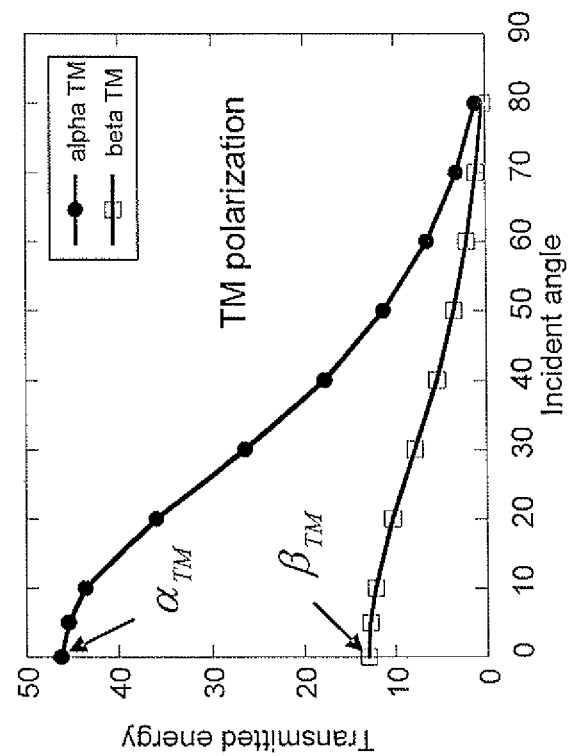

FIGS. 22A and 22B show the TM polarization case. As shown in FIG. 22A, the values for are $\alpha_{TM}$ and $\beta_{TM}$ specified in Equations (1) are for a 0 degree incident angle. By normalizing the curves by $\alpha_{TM}$ and $\beta_{TM}$, respectively, FIG. 22B is obtained. It is seen that the two apertures have the same properties in terms of dependence on the incident angle for the TM polarization also. Thus, the angular dependence of transmittance is the same for both the apertures for the TE and TM polarizations, respectively.

The measured image signal by the α aperture is described as follows:

$$I_\alpha(x) = R_\alpha Y_\alpha \alpha_{TE} I_{TE}^{out}(x) + R_\alpha Y_\alpha \alpha_{TM} I_{TM}^{out}(x) \quad (4)$$

The measured image by the β aperture is described as follows:

$$I_\beta(x) = R_\beta Y_\beta \beta_{TE} I_{TE}^{out}(x) + R_\beta Y_\beta \beta_{TM} I_{TM}^{out}(x) \quad (5)$$

$Y_\alpha$ and $Y_\beta$ are the aperture lengths for the α aperture and the β aperture, respectively. $R_\alpha$ is a coefficient representing the sensitivity of the portion detector 115 that detects light transmitted through the α aperture. $R_\beta$ is a coefficient representing the sensitivity of the portion of detector 115 that detects light transmitted through the β aperture. $R_\alpha$ and $R_\beta$ are controllable electrically. The parameters in Equations (4) and (5) are set so that the following equation is satisfied:

$$R_\alpha Y_\alpha \alpha_{TM} = R_\beta Y_\beta \beta_{TM} \quad (6)$$

For simplicity, the following is assumed:

$$R_\alpha = R_\beta = 1 \quad (7)$$

Therefore, the following equation must be satisfied:

$$Y_\beta / Y_\alpha = \alpha_{TM} / \beta_{TM} \quad (8)$$

In the first example embodiment of the invention, $\alpha_{TM} = 46.3$ and $\beta_{TM} = 13.0$. These values are represented in an arbitrary unit. By setting $Y_\alpha = 1$ and $Y_\beta = 3.56$, Equations (4) and (5) are transformed to Equations (9) and (10), respectively:

$$I_\alpha(x) = 243.8 \times I_{TE}^{out}(x) + 46.3 \times I_{TM}^{out}(x) \quad (9)$$

$$I_\beta(x) = 46.3 \times I_{TE}^{out}(x) + 46.3 \times I_{TM}^{out}(x) \quad (10)$$

By subtracting Equation (9) from Equation (10), the following equation is obtained:

$$I_{TE}^{out}(x) = \frac{I_\alpha(x) - I_\beta(x)}{197.5} \quad (11)$$

Using Equation (11), $I_{TM}^{out}(x)$ is given by either Equation (12) or Equation (13):

$$I_{TM}^{out}(x) = \frac{1}{46.3} I_\alpha(x) - \frac{243.8}{46.3} I_{TE}^{out}(x) \quad (12)$$

$$I_{TM}^{out}(x) = \frac{1}{46.3} I_\beta(x) - I_{TE}^{out}(x) \quad (13)$$

Equations (12) and (13) should match with each other if the measurement of $I_\alpha(x)$ and $I_\beta(x)$ are conducted ideally, without errors. The difference between Equations (12) and (13), if any, can be used as an indicator of measurement errors.

Figure 23:
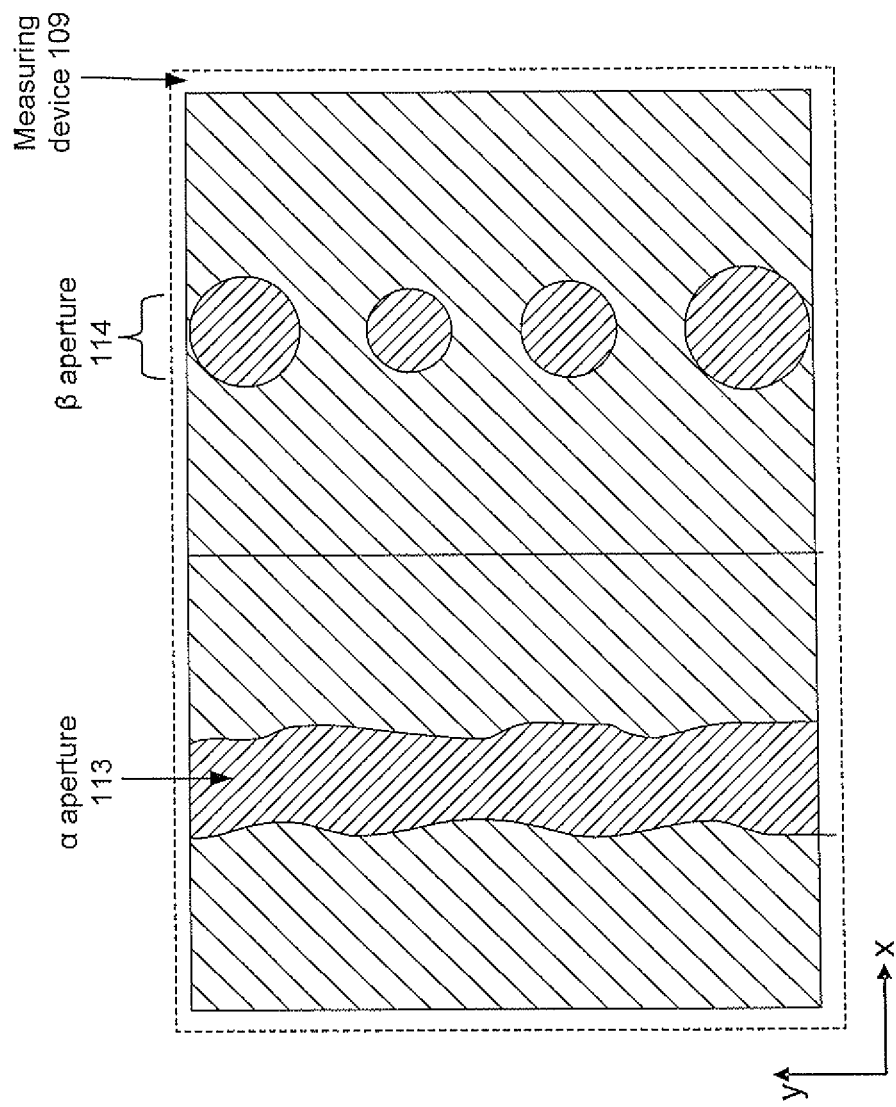
FIGS. 23 and 24 illustrate fabrication errors.
Figure 24:
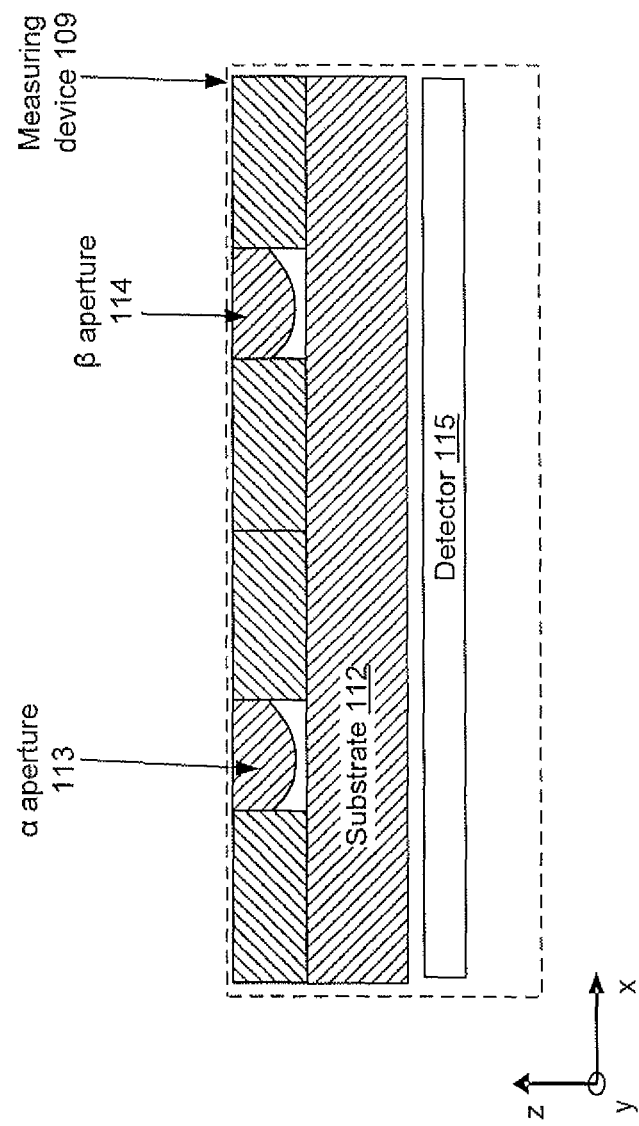

One error source is aperture fabrication error, which may not be avoidable for small aperture sizes. FIG. 23 is a top view of a portion of measuring device 109 showing typical fabrication errors, and FIG. 24 is a cross-sectional view of measuring device 109 showing typical fabrication errors. The fluctuation of aperture size for both a slit aperture and a pinhole array aperture is shown in FIG. 23, and incomplete filling in the aperture space (for either a slit aperture or a pinhole array aperture) is shown in FIG. 24. These fabrication errors have influences on the value of transmitted energy. Actual transmitted energy will be different from the result of simulations which does not assume fabrication errors. To compensate for fabrication errors, the transmitted energy of the two apertures is measured, and the parameters $R_\alpha$ and $R_\beta$ are adjusted so that Equation (6) is satisfied. The parameters $R_\alpha$ and $R_\beta$ are adjusted by controlling the signal amplitude from the photo-diodes included in the portion of detector 115 that detects light transmitted through the α aperture and the β aperture, respectively.

In the first example embodiment, the conditions for Equation (6) have been chosen because the α aperture has the transmittance for the TE and TM polarizations as indicated by the values in Equations (1). As indicated by the values in Equations (1), the α aperture shows high transmittance for the TE polarization and it is thought to effectively cancel out the TM polarization components in the measurement results of $I_\alpha(x)$ and $I_\beta(x)$. In other embodiments, in which the TM polarization is dominant in one of the apertures, the following equation may be applied instead of Equation (6):

$$R_\alpha Y_\alpha \alpha_{TE} = R_\beta Y_\beta \beta_{TE} \qquad (14)$$

When Equation (14) is used, $I_{TM}^{out}(x)$ is calculated by subtracting Eq. (5) from Equation (4), and $I_{TE}^{out}(x)$ is obtained using the result of $I_{TM}^{out}(x)$.

A more detailed description of the image recovery processes of blocks 2005 (TE component) and 2009 (TM component) follows. Control device 110 performs the image recovery process after performing the polarization separation process (block 2003 of FIG. 20) and obtaining the image profile for the TE component ($I_{TE}^{out}(x)$) at block 2004 of FIG. 20, and obtaining the image profile for the TM component ($I_{TM}^{out}(x)$) at block 2008 of FIG. 20. Control device 110 performs a TE image recovery process to recover the TE component of image 108 ($I_{TE}^{in}(x)$) from the generated image profile for the TE component ($I_{TE}^{out}(x)$), and performs a TM recovery process to recover the TM component of image 108 ($I_{TM}^{in}(x)$) from the generated image profile for the TM component ($I_{TM}^{out}(x)$). Image recovery for both the TM and the TE components is performed by applying iterative calculations.

Figure 25:
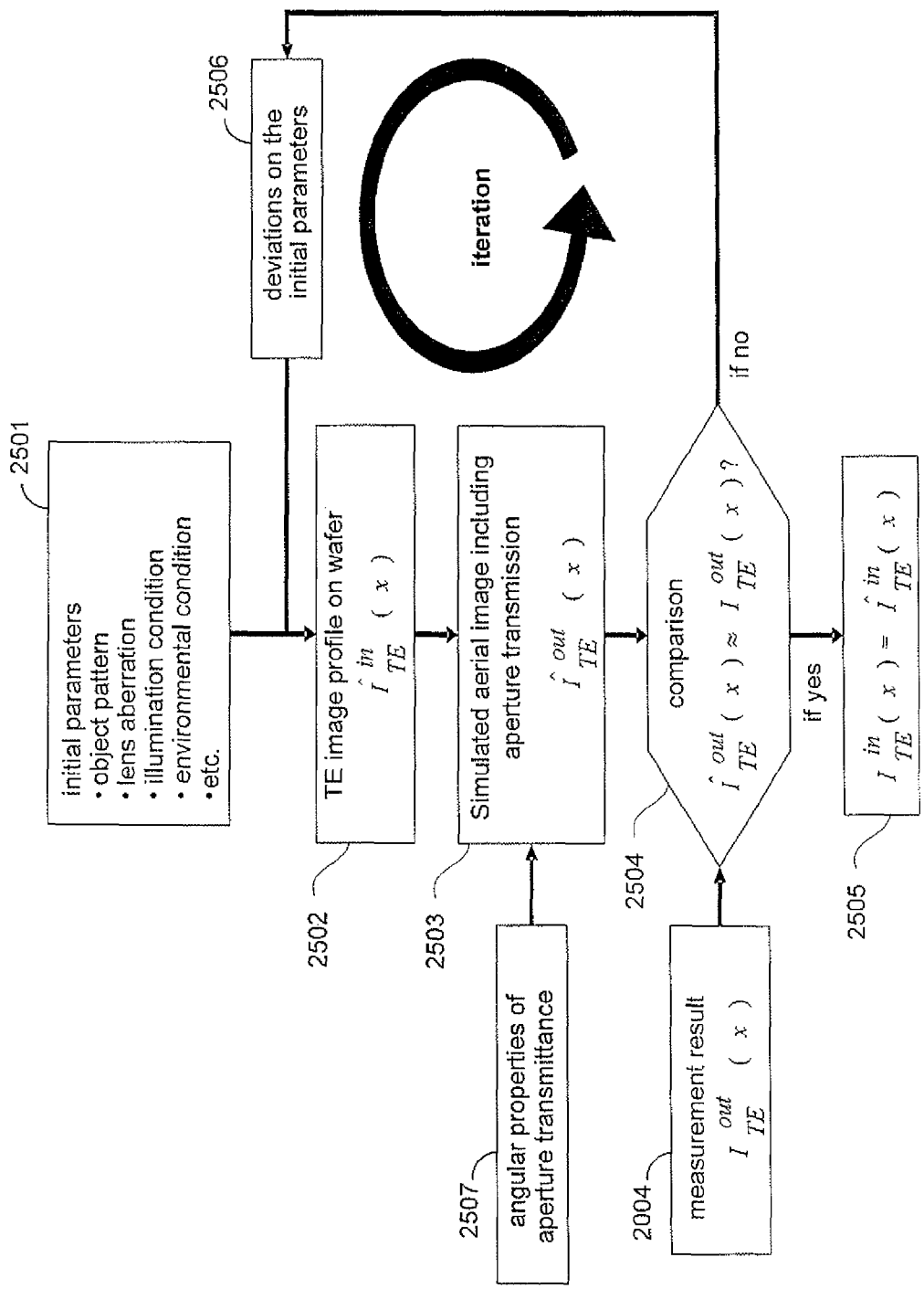
FIG. 25 is a flow diagram illustrating the TE image recovery process for the TE polarization component, according to the first example embodiment.

FIG. 25 is a flow diagram illustrating the TE image recovery process for the TE polarization component (block 2005 of FIG. 20). Using initial parameters 2501 including for, example, the pattern on reticle 102, aberration of lens 107, illumination conditions of illumination system 104, and environmental conditions (e.g., temperature, barometric pressure), and the like, the image intensity distribution on wafer 103 for the TE component ($\hat{I}_{TE}^{in}(x)$) is calculated (block 2502). At block 2503, a transmitted TE image profile ($\hat{I}_{TE}^{out}(x)$) representing the calculated original TE image profile ($\hat{I}_{TE}^{in}(x)$) changed by transmission through the apertures is calculated using data 2507. Data 2507 indicates properties of aperture transmittance that include angular properties of transmittance through the apertures. At block 2504, the transmitted TE image profile ($\hat{I}_{TE}^{out}(x)$) is compared with the image profile for the TE polarization component ($I_{TE}^{out}(x)$) (generated at block 2004 of FIG. 20) to determine whether $\hat{I}_{TE}^{out}(x)$ is substantially equal to $I_{TE}^{out}(x)$.

If $\hat{I}_{TE}^{out}(x)$ is substantially equal to $I_{TE}^{out}(x)$ ("YES" at block 2504), then at block 2505 the calculated original TE image profile $\hat{I}_{TE}^{in}(x)$ is provided as the estimated TE image profile (i.e., $I_{TE}^{in}(x)$) obtained at block 2006 of FIG. 20. Control device 110 provides the estimated TE image profile $I_{TE}^{in}(x)$ to a user via its user output device. In other embodiments, control device 110 can provide the estimated TE image profile $I_{TE}^{in}(x)$ to another device via its communication device.

If $\hat{I}_{TE}^{out}(x)$ is substantially equal to $I_{TE}^{out}(x)$ ("YES" at block 2504), then it is also determined that initial parameters 2501 represent the actual performance of optical lithography system 100. In the first example embodiment, control device 110 outputs parameters 2501 to a user via the user output device. In other embodiments, controller 110 can output information derived from parameters 2501, such as, for example, information indicating a change, or lack of change, in parameters 2501. By monitoring the change of these parameters through the measurement of aerial images, the performance of optical lithography system 100 can be monitored with improved accuracy.

If $\hat{I}_{TE}^{out}(x)$ is not substantially equal to $I_{TE}^{out}(x)$ ("NO" at block 2504), then at block 2506, controller 110 deviates initial parameters 2501, and begins a next iteration of image recovery by calculating a new original image profile using the deviated parameters at block 2502.

In another example embodiment, instead of calculating the image profile $\hat{I}_{TE}^{out}(x)$ for each iteration of image recovery, an image profile $\hat{I}_{TE}^{out}(x)$ can be calculated in advance for all possible parameter combinations, and the calculated image profiles can be stored in a database. In this manner, the corresponding image profile $\hat{I}_{TE}^{out}(x)$ for specified parameters can be retrieved from the database, instead of being calculated, in each iteration of the TE image recovery process. Similarly, an image profile $\hat{I}_{TE}^{in}(x)$ can be calculated in advance for all possible parameter combinations, the calculated image profiles can be stored in a database, and the corresponding image profile $\hat{I}_{TE}^{in}(x)$ for specified parameters can be retrieved from the database, instead of being calculated, in each iteration of the TE image recovery process.

Figure 26:
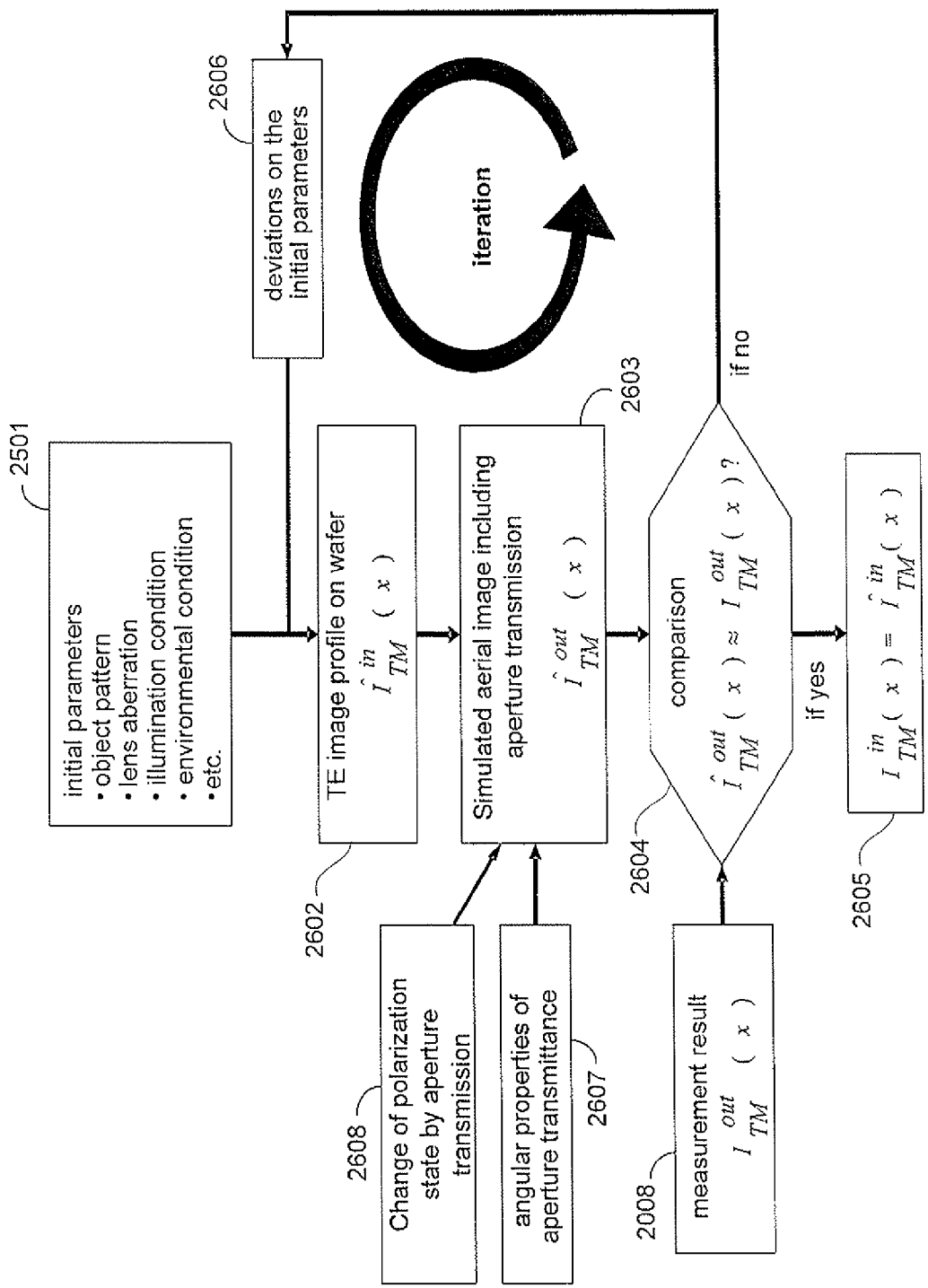
FIG. 26 is a flow diagram illustrating the TM image recovery process for the TM polarization component, according to the first example embodiment.

FIG. 26 is a flow diagram illustrating the TM image recovery process for the TM polarization component (block 2009 of FIG. 20). The initial parameters used in the TM image recovery process are the same initial parameters 2501 used in the TE image recovery process. Using initial parameters 2501 the image intensity distribution on wafer 103 for the TM component ($\hat{I}_{TM}^{in}(x)$) is calculated (block 2602). At block 2603, a transmitted TM image profile ($\hat{I}_{TM}^{out}(x)$) representing the calculated original TM image profile ($\hat{I}_{TM}^{in}(x)$) changed by transmission through the apertures is calculated using data 2607 and data 2608. Data 2607 indicates properties of aperture transmittance that include angular properties of transmittance through the apertures, and data 2608 indicates properties of aperture transmittance that include polarization change properties. At block 2604, the transmitted TM image profile ($\hat{I}_{TM}^{out}(x)$) is compared with the image profile for the TM polarization component ($I_{TM}^{out}(x)$) to determine whether $\hat{I}_{TM}^{out}(x)$ is substantially equal to $I_{TM}^{out}(x)$.

If $\hat{I}_{TM}^{out}(x)$ is substantially equal to $I_{TM}^{out}(x)$ ("YES" at block 2604), then at block 2605 the calculated original TM image profile $\hat{I}_{TM}^{in}(x)$ is provided as the estimated TM image profile (i.e., $I_{TM}^{in}(x)$) obtained at block 2010 of FIG. 20. Control device 110 provides the estimated TM image profile $I_{TM}^{in}(x)$ to a user via its user output device. In other embodiments, control device 110 can provide the estimated TM image profile $I_{TM}^{in}(x)$ to another device via its communication device.

If $\hat{I}_{TM}^{out}(x)$ is substantially equal to $I_{TM}^{out}(x)$ ("YES" at block 2504), then it is also determined that initial parameters 2501 represent the actual performance of optical lithography system 100. In the first example embodiment, control device 110 outputs parameters 2501 to a user via the user output device. In other embodiments, controller 110 can output information derived from parameters 2501, such as, for example, information indicating a change, or lack of change, in parameters 2501. By monitoring the change of these parameters through the measurement of aerial images, the performance of optical lithography system 100 can be monitored with improved accuracy.

If $\hat{I}_{TM}^{out}(x)$ is not substantially equal to $I_{TM}^{out}(x)$ ("NO" at block 2604), then at block 2606, controller 110 deviates initial parameters 2501, and begins a next iteration of image recovery by calculating a new original image profile using the deviated parameters at block 2602.

In another example embodiment, instead of calculating the image profile $\hat{I}_{TM}^{out}(x)$ for each iteration of image recovery, an image profile $\hat{I}_{TM}^{out}(x)$ can be calculated in advance for all possible parameter combinations, and the calculated image profiles can be stored in a database. In this manner, the corresponding image profile $\hat{I}_{TM}^{out}(x)$ for specified parameters can be retrieved from the database, instead of being calculated, in each iteration of the TM image recovery process. Similarly, an image profile $\hat{I}_{TM}^{in}(x)$ can be calculated in advance for all possible parameter combinations, the calculated image profiles can be stored in a database, and the corresponding image profile $\hat{I}_{TM}^{in}(x)$ for specified parameters can be retrieved from the database, instead of being calculated, in each iteration of the TM image recovery process.

Second Embodiment

Figure 27:
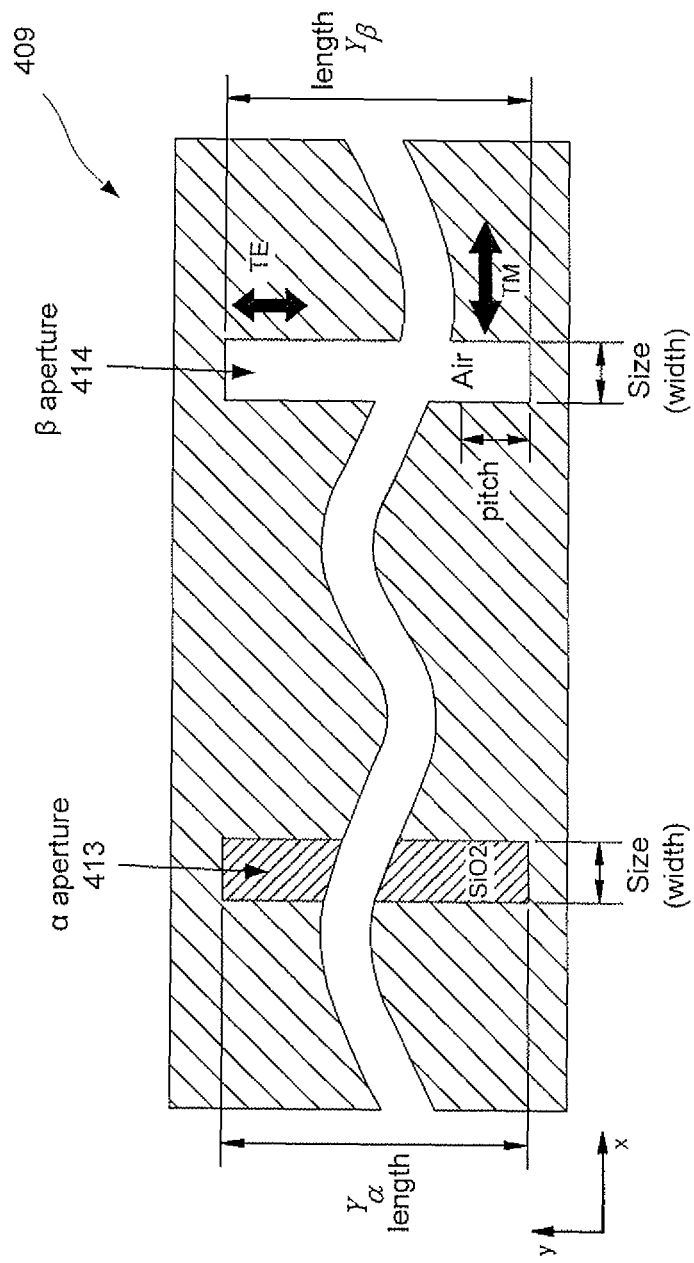
FIG. 27 is a top view of a measuring device, according to a second example embodiment.

FIG. 27 is a top view of a measuring device 409, according to a second example embodiment. Aperture 413 is a slit aperture (α aperture), and aperture 414 is also a slit aperture (β aperture). Aperture 413 has a width of 60 nm and a length of 30 μm, and aperture 414 has a width of 60 nm and a length of 30 μm.

Figure 28:
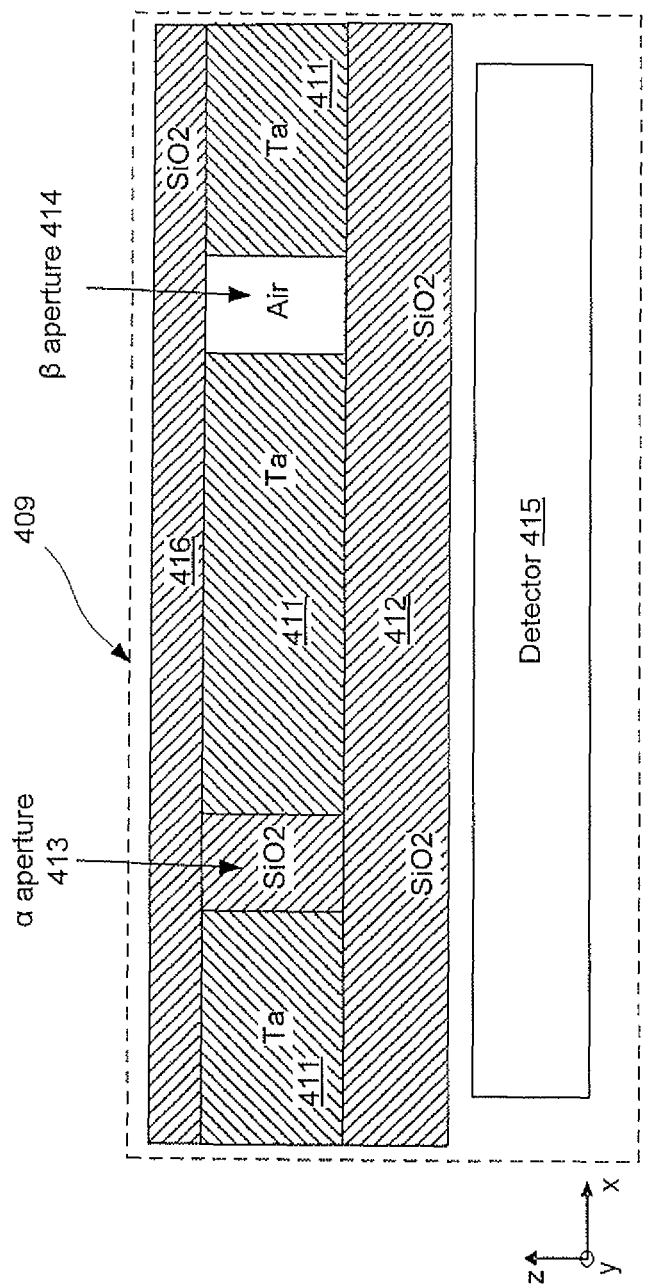
FIG. 28 is a cross-sectional view of the measuring device of FIG. 27.

FIG. 28 is a cross-sectional view of a measuring device 409, according to the second example embodiment. As shown in FIG. 28, light blocking layer 411 is formed between SiO2 top cover layer 416 and SiO2 substrate 412. The material of light blocking layer 411 is Ta (tantalum), and its thickness is 120 nm. The thickness of top cover layer 416 is 40 nm. Light passes through top cover layer 416, apertures 413 and 414, and substrate 412 to reach detector 415. In the second example embodiment, aperture 413 is filled with SiO2 and aperture 414 has a hollow structure. Water is filled between the projection lens of the optical lithography system and the surface of measuring device 409 when the controller controls the wafer stage to move measuring device 409 under the lens to scan the image. Therefore, SiO2 top cover layer 416 is used to prevent water from entering into the aperture space of aperture 414.

In the second embodiment, aperture 413 substantially blocks the transmission of the TM polarization component (transmitting only the TE component), and aperture 414 substantially blocks the transmission of the TE polarization component (transmitting only the TM component). Therefore, in the second example embodiment, since aperture 413 transmits only the TE component and aperture 414 transmits only the TM component, a separate polarization separation process (e.g., step 2003 of FIG. 20), does not need to be performed as part of the image measuring process. Thus, the image measuring process of the second embodiment is the same as the image measuring process of the first embodiment, except for the fact that the polarization separation process (e.g., step 2003 of FIG. 20) is skipped.

Third Embodiment

Figure 29:
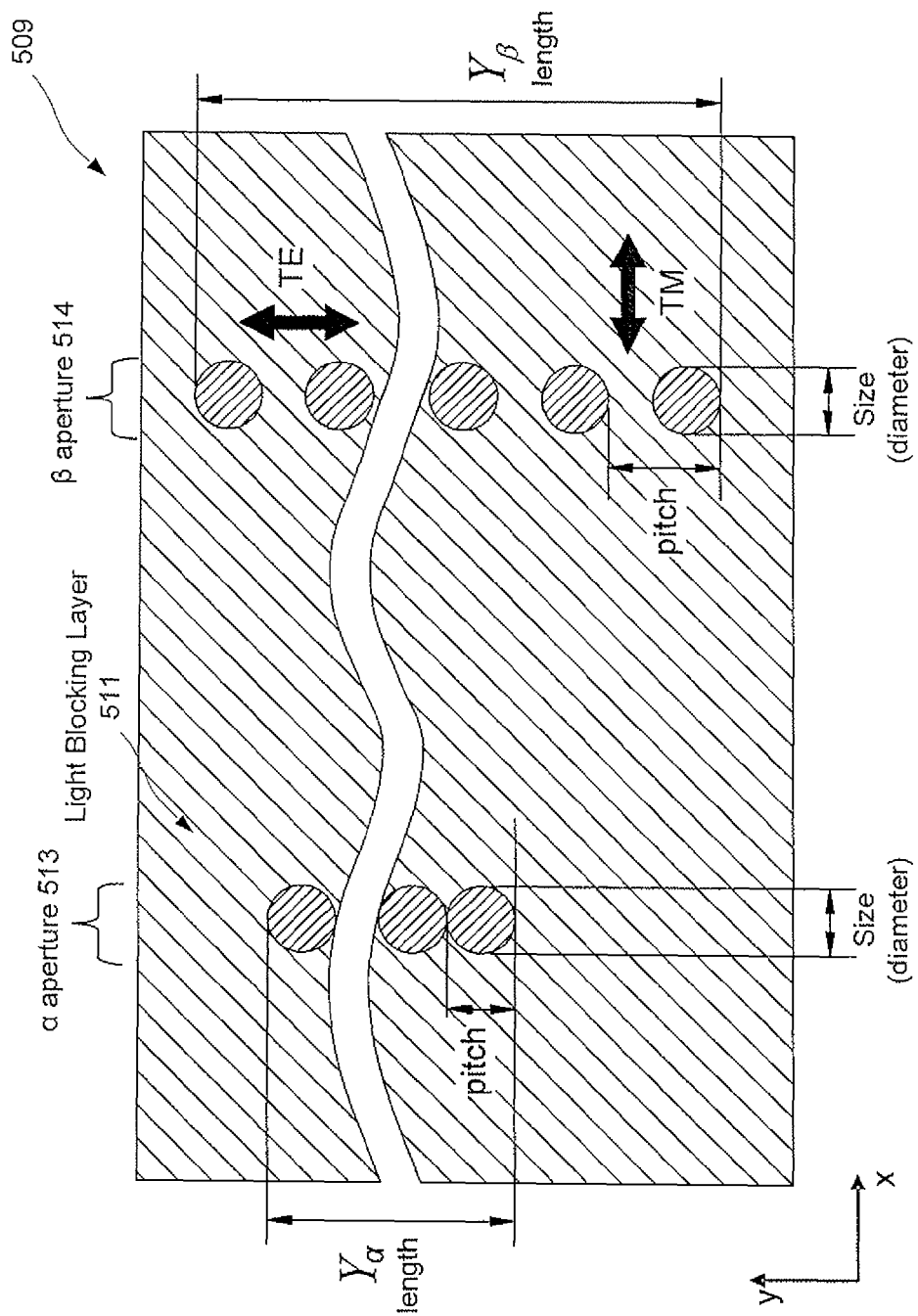
FIG. 29 is a top view of a measuring device, according to a third example embodiment.

FIG. 29 is a top view of a measuring device 509, according to a third example embodiment. Aperture 513 is a pinhole array aperture (α aperture), and aperture 514 is also a pinhole array aperture (β aperture). Aperture 513 has a diameter of 80 nm, a pitch of 80 nm, and a length of 15 μm. Aperture 514 has a diameter of 80 nm, a pitch of 160 nm, and a length of 30 μm. The material of light blocking layer 511 is Ta (tantalum), and its thickness is 100 nm.

Using the disclosed optical lithography system, an image profile that may accurately represent the imaging performance of the optical lithography system may be generated. Moreover, such an image profile may be generated for an image containing multiple polarization components. More specifically, because separate image profiles for each polarization component of the aerial image are generated, image recovery that addresses properties of image profile change unique to each polarization component may be performed. For example, image recovery for the generated image profile for a Transverse Electric (TE) polarization component can address angular properties of transmittance, whereas image recovery for the generated image profile for a Transverse Magnetic (TM) polarization component can address both polarization change properties and angular properties of transmittance.

Because the slit aperture and the pinhole array aperture can have significantly different polarization properties, the effects of noise on the measurements obtained by the aerial image measuring device may be reduced, or substantially eliminated. Furthermore, manufacturing an aerial image measuring device having a slit aperture and a pinhole array aperture having significantly different polarization properties is not believed to be difficult to manufacture.

Because image recovery can be performed by applying iterative calculations separately for each of the generated image profiles, it may be possible to perform image recovery in an optical lithography system in which image formation is non-linear and governed by partially coherent imaging theory.

In the above-described embodiments, the first aperture and the second aperture are included in the same light blocking layer, and a single detector measures both light transmitted through the first aperture and light transmitted through the second aperture. Additionally, above-described embodiments show the first and second apertures formed on the same substrate. However, in other embodiments, the first aperture and the second aperture can be included in different light blocking layers, and the above-described polarization separation and image recovery processes can be applied without modification. Moreover, in other embodiments, the first aperture and the second aperture can be formed on different substrates, and the above-described polarization separation and image recovery processes can be applied without modification. Furthermore, other embodiments can include a first detector and a second detector, and the first detector can measure light transmitted through the first aperture, the second detector can measure light transmitted through the second aperture, and the above-described polarization separation and image recovery processes can be applied without modification. The first detector can provide samples for light transmitted through the first aperture to the control device, and the second detector can provide samples for light transmitted through the second aperture to the control device.

Figure 30:
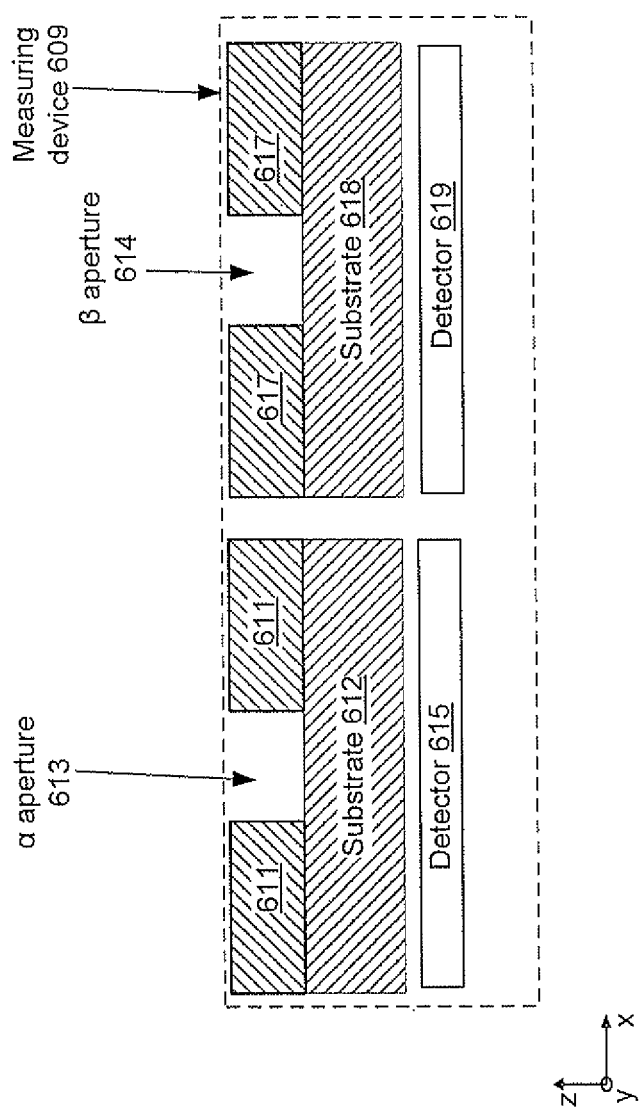
FIG. 30 is a cross-sectional view of a measuring device according to an example embodiment.

FIG. 30 shows a cross-sectional view of measuring device 609 having apertures 613 and 614 included in different light blocking layers 611 and 617 (respectively), and having a different detector for each aperture. Light blocking layers 611 and 617 are formed on different substrates 612 and 618 (respectively). Light blocking layer 611 is formed on SiO2 (silicon dioxide) substrate 612, and light transmitted through aperture 613 passes through substrate 612 to reach detector 615. Light blocking layer 617 is formed on SiO2 (silicon dioxide) substrate 618, and light transmitted through aperture 614 passes through substrate 618 to reach detector 619.

The exemplary embodiments of the invention have been described above with respect to particular illustrative embodiments, however, various changes and modifications may be made without departing from the scope of the invention. For example, in general, steps of methods described above may be performed in a different order and still achieve desirable results.

What is claimed is:

1. An aerial image measuring device used to measure an aerial image, the device comprising:
    a light blocking layer having at least a first aperture and a second aperture, wherein the first aperture comprises a slit, and the second aperture comprises a pinhole array, and wherein the first aperture transmits a light of at least one of TM and TE polarization components which is different from a light of the polarization components which the second aperture transmits;
    a detector which detects light transmitted through the first aperture and light transmitted through the second aperture; and
    a calculation unit which uses the light transmitted through the first aperture and the light transmitted through the second aperture to calculate the aerial image,
    wherein the pinhole array comprises a plurality of pinholes arranged in a longitudinal direction of the slit, the plurality of pinholes being formed with spacing such that properties of the TM and TE polarization components transmitted through the pinhole array are equal.

2. The aerial image measuring device of claim 1, wherein the pinhole array aperture is specified by a pinhole diameter, by a pitch which specifies the distance between each pinhole in the array, and by a length.

3. The aerial image measuring device of claim 2, wherein the pinhole diameter of both the pinhole array aperture and the slit aperture have a size smaller than both a feature size of the aerial image and a wavelength of light generated by the illumination system.

4. The aerial image measuring device of claim 2, wherein the light blocking layer material, light blocking layer thickness, pinhole diameter, and material in the aperture space for the pinhole array aperture and for the slit aperture are the same.

5. The aerial image measuring device of claim 4, wherein for the pinhole array aperture, the light blocking layer thickness is 100 nm, the pinhole diameter size is 80 nm, the pitch is 160 nm, and for the slit aperture, the light blocking layer thickness is 100 nm, the pinhole diameter size is 80 nm, the pitch is 0 nm, and the ratio of the length of the pinhole array aperture to the length of the slit aperture is about 18:5.

6. The aerial image measuring device of claim 1, wherein a material in the aperture space for the pinhole array aperture and for the slit aperture is SiO2 (silicon dioxide), and the material of the light blocking layer is Ta (tantalum).

7. The aerial image measuring device of claim 1, wherein the light blocking layer is formed on the detector.

8. The aerial image measuring device of claim 1, wherein the light blocking layer is formed on a substrate, and light transmitted through the first and second apertures passes through the substrate to reach the detector.

9. The aerial image measuring device of claim 8, wherein the substrate is a SiO2 (silicon dioxide) substrate.

10. The aerial image measuring device of claim 8, wherein the aerial image measuring device has a lens arranged between the substrate and the detector.

11. The aerial image measuring device of claim 1, wherein the calculation unit combines the light transmitted through the first aperture and the light transmitted through the second aperture so as to calculate an estimate of the aerial image in which the effects of detecting through the first and second apertures are excluded.

12. The aerial image measuring device according to claim 1, wherein the properties indicate transmittance of light transmitted through the pinhole array.

13. An aerial image measuring device used to measure an aerial image, the device comprising:
    a first light blocking layer having at least a first aperture;
    a second light blocking layer having at least a second aperture;
    a first detector which detects light transmitted through the first aperture;
    a second detector which detects light transmitted through the second aperture; and
    a calculation unit which uses the light transmitted through the first aperture and the light transmitted through the second aperture to calculate the aerial image,
    wherein the first aperture comprises a slit, and the second aperture comprises a pinhole array, and wherein the first aperture transmits a light of at least one of TM and TE polarization components which is different from a light of the polarization components which the second aperture transmits,
    wherein the pinhole array comprises a plurality of pinholes arranged in a longitudinal direction of the slit, the plurality of pinholes being formed with spacing such that properties of the TM and TE polarization components transmitted through the pinhole array are equal.

14. A method for measuring an aerial image produced by an optical lithography system, the method comprising:
    sampling the aerial image with an aerial image measuring device having first and second light detectors and first and second light blocking layers, wherein the first light blocking layer has a first aperture which comprises a slit and the second light blocking layer has a second aperture which comprises a pinhole array, wherein the first aperture transmits a light of at least one of TM and TE polarization components which is different from a light of the polarization components which the second aperture transmits, and wherein the first detector detects light transmitted through the first aperture and the second detector detects light transmitted through the second aperture;
    generating an image profile for the TM polarization component and an image profile for the TE polarization component of the aerial image using the light detected by the first detector and the light detected by the second detector; and
    performing image recovery for each of the generated image profiles to generate estimated image profiles for each of the TM and the TE polarization components of the aerial image that exclude the effects of transmission through the first and second apertures of the aerial image measuring device,
    wherein the pinhole array comprises a plurality of pinholes arranged in a longitudinal direction of the slit, the plurality of pinholes being formed with spacing such that properties of the TM and TE polarization components transmitted through the pinhole array are equal.

15. A method for measuring an aerial image produced by an optical lithography system, the method comprising:
    sampling the aerial image with an aerial image measuring device having a light detector and a light blocking layer, wherein the light blocking layer has a first aperture and a second aperture, wherein the first aperture comprises a slit, and the second aperture comprises a pinhole array, wherein the first aperture transmits a light of at least one of TM and TE polarization components which is different from a light of the polarization components which the second aperture transmits, and wherein the detector detects light transmitted through the first aperture and light transmitted through the second aperture;

generating an image profile for the TM polarization component and an image profile for the TE polarization component of the aerial image using the light transmitted through the first aperture and the light transmitted through the second aperture that is detected by the detector; and performing image recovery for each of the generated image profiles to generate estimated image profiles for each of the TM and the TE polarization components of the aerial image that exclude the effects of transmission through the first and second apertures of the aerial image measuring device, wherein the pinhole array comprises a plurality of pinholes arranged in a longitudinal direction of the slit, the plurality of pinholes being formed with spacing such that properties of the TM and TE polarization components transmitted through the pinhole array are equal.

16. The method of claim 15, wherein the polarization components include a Transverse Electric (TE) polarization component and a Transverse Magnetic (TM) polarization component, wherein the pinhole array aperture and the slit aperture have significantly different polarization properties, and wherein the pinhole array aperture is used to transmit the TM polarization component and the TE polarization component, and the slit aperture is used to transmit the TE polarization component.

17. The method of claim 16, wherein the control device performs image recovery by applying iterative calculations separately for each of the generated image profiles, wherein each iteration of image recovery comprises:

calculating an original image profile for one of the polarization components of the aerial image using parameters of the optical lithography system;

calculating a transmitted image profile for the polarization component that includes the effects of transmission through the aperture used to transmit the polarization component, by changing the original image profile using properties of aperture transmittance;

comparing the transmitted image profile with the generated image profile for the polarization component to determine whether the generated image profile is substantially equal to the transmitted image profile;

responsive to a determination that the generated image profile is substantially equal to the transmitted image profile, providing the calculated original image profile as the estimated image profile for the polarization component that excludes the effects of transmission through the aperture; and responsive to a determination that the generated image profile is not substantially equal to the transmitted image profile, deviating the initial parameters and beginning a next iteration of image recovery by calculating a new original image profile using the deviated parameters.

18. The method of claim 17, wherein for the TE polarization component, the properties of aperture transmittance include angular properties of transmittance through the slit aperture, and for the TM polarization component, the properties of aperture transmittance include polarization change properties and angular properties of transmittance through the pinhole array aperture.

19. The method of claim 17, wherein the parameters of the optical lithography system include the pattern on the reticle, lens aberrations, illumination conditions, and environmental conditions.

20. An optical lithography system comprising:
an illumination system;
a reticle;
a projection lens;
a moveable wafer stage;
an aerial image measuring device having a light detector and a light blocking layer for separating polarization components of light incident thereon, wherein the light blocking layer has a first aperture and a second aperture, wherein the first aperture comprises a slit, and the second aperture comprises a pinhole array, and wherein the detector detects a light transmitted through the first aperture and a light transmitted through the second aperture; and a control device for controlling the aerial image measuring device and the wafer stage, wherein the pinhole array comprises a plurality of pinholes arranged in a longitudinal direction of the slit, the plurality of pinholes being formed with spacing such that properties of TM and TE polarization components transmitted through the pinhole array are equal, wherein the aerial image measuring device is positioned on the wafer stage, and the illumination system illuminates a pattern on the reticle to generate light beams that are projected onto the aerial image measuring device by the projection lens to create an aerial image corresponding to the pattern, and wherein the control device controls the wafer stage to move so that the aerial image is scanned by the aerial image measuring device, and the control device receives the light transmitted through the first aperture and the light transmitted through the second aperture detected by the detector, generates separate image profiles for each polarization component of the aerial image using the light transmitted through the aperture and the light transmitted through the second aperture detected by the detector, and performs image recovery for each of the generated image profiles to generate estimated image profiles for each polarization component of the aerial image that exclude the effects of transmission through the first and second apertures of the aerial image measuring device.

21. The optical lithography system of claim 20, wherein the pinhole array aperture is specified by a pinhole diameter, by a pitch which specifies the distance between each pinhole in the array, and by a length.

22. The optical lithography system of claim 21, wherein the light blocking layer material, light blocking layer thickness, pinhole diameter, and material in the aperture space for the pinhole array aperture and for the slit aperture are the same.

23. The optical lithography system of claim 22, wherein for the pinhole array aperture, the light blocking layer thickness is 100 nm, the pinhole diameter size is 80 nm, the pitch is 160 nm, and for the slit aperture, the light blocking layer thickness is 100 nm, the pinhole diameter size is 80 nm, the pitch is 0 nm, and the ratio of the length of the pinhole array aperture to the length of the slit aperture is about 18:5.

24. The optical lithography system of claim 20, wherein the pinhole diameter of both the pinhole array aperture and the slit aperture have a size smaller than both a feature size of the aerial image and a wavelength of light generated by the illumination system.

25. The optical lithography system of claim 20, wherein a material in the aperture space for the pinhole array aperture and for the slit aperture is SiO2 (silicon dioxide), and the material of the light blocking layer is Ta (tantalum).

26. The optical lithography system of claim 20, wherein the light blocking layer is formed on the detector.

27. The optical lithography system of claim 20, wherein the light blocking layer is formed on a substrate, and light transmitted through the first and second apertures passes through the substrate to reach the detector.

28. The optical lithography system of claim 27, wherein the substrate is a SiO2 (silicon dioxide) substrate.

29. The optical lithography system of claim 27, wherein the aerial image measuring device has a lens arranged between the substrate and the detector.

30. The optical lithography system of claim 20, wherein the polarization components include a Transverse Electric (TE) polarization component and a Transverse Magnetic (TM) polarization component, wherein the pinhole array aperture and the slit aperture have significantly different polarization properties, and wherein the pinhole array aperture is used to transmit the TM polarization component and the TE polarization component, and the slit aperture is used to transmit the TE polarization component.

31. The optical lithography system of claim 30, wherein the control device performs image recovery by applying iterative calculations separately for each of the generated image profiles, wherein each iteration of image recovery comprises:
    calculating an original image profile for one of the polarization components of the aerial image using parameters of the optical lithography system;
    calculating a transmitted image profile for the polarization component that includes the effects of transmission through the apertures, by changing the original image profile using properties of aperture transmittance;
    comparing the transmitted image profile with the generated image profile for the polarization component to determine whether the generated image profile is substantially equal to the transmitted image profile;
    responsive to a determination that the generated image profile is substantially equal to the transmitted image profile, providing the calculated original image profile as the estimated image profile for the polarization component that excludes the effects of transmission through the apertures; and
    responsive to a determination that the generated image profile is not substantially equal to the transmitted image profile, deviating the initial parameters and beginning a next iteration of image recovery by calculating a new original image profile using the deviated parameters.

32. The optical lithography system of claim 31, wherein for the TE polarization component, the properties of aperture transmittance include angular properties of transmittance through the apertures, and for the TM polarization component, the properties of aperture transmittance include polarization change properties and angular properties of transmittance through the apertures.

33. The optical lithography system of claim 31, wherein the parameters of the optical lithography system include the pattern on the reticle, lens aberrations, illumination conditions, and environmental conditions.

34. An aerial image measuring device used to measure an aerial image, the device comprising:
    a light blocking layer having at least a first aperture and a second aperture, wherein the first aperture comprises a slit, and the second aperture comprises a pinhole array, and wherein the first aperture transmits a light of at least one of TM and TE polarization components which is different from a light of the polarization components which the second aperture transmits;
    a detector which detects light transmitted through the first aperture and light transmitted through the second aperture; and
    a calculation unit which uses the light transmitted through the first aperture and the light transmitted through the second aperture to calculate the aerial image,
    wherein the pinhole array comprises a plurality of pinholes being arranged in a longitudinal direction of the slit, the plurality of pinholes being formed with spacing such that a difference between transmittances of the TM and TE polarization components transmitted through the pinhole array is less than a difference between transmittances of the TM and TE polarization components transmitted through the slit.

* * * * *